US012787338B2

(12) United States Patent
Park et al.

(10) Patent No.: US 12,787,338 B2
(45) Date of Patent: Nov. 3, 2026

(54) ELECTRONIC DEVICE

(71) Applicants: INDUSTRY-UNIVERSITY COOPERATION FOUNDATION HANYANG UNIVERSITY ERICA CAMPUS, Ansan-si (KR); AJOU UNIVERSITY INDUSTRY-ACADEMIC COOPERATION FOUNDATION, Suwon-si (KR)

(72) Inventors: Tae Joo Park, Ansan-si (KR); Sang Woon Lee, Yongin-si (KR); Tae Jun Seok, Ansan-si (KR); Ji Hyeon Choi, Icheon-si (KR)

(73) Assignees: INDUSTRY-UNIVERSITY COOPERATION FOUNDATION HANYANG UNIVERSITY ERICA CAMPUS, Gyeonggi-do (KR); AJOU UNIVERSITY INDUSTRY-ACADEMIC COOPERATION FOUNDATION, Gyeonggi-do (KR)

( * ) Notice: Subject to any disclaimer, the term of this patent is extended or adjusted under 35 U.S.C. 154(b) by 719 days.

(21) Appl. No.: 17/953,101

(22) Filed: Sep. 26, 2022

(65) Prior Publication Data

US 2023/0101276 A1 Mar. 30, 2023

(30) Foreign Application Priority Data

Sep. 27, 2021 (KR) ........................ 10-2021-0127248
Sep. 22, 2022 (KR) ........................ 10-2022-0120371

(51) Int. Cl.
*H10D 30/47* (2025.01)
*H10D 64/68* (2025.01)
(Continued)

(52) U.S. Cl.
CPC ........... *H10D 30/47* (2025.01); *H10D 30/473* (2025.01); *H10D 30/474* (2025.01);
(Continued)

(58) Field of Classification Search
CPC .... H10D 30/47; H10D 30/473; H10D 30/474; H10D 30/475; H10D 64/691; H01L 21/02178; H01L 21/02189; H01L 21/022
See application file for complete search history.

(56) References Cited

U.S. PATENT DOCUMENTS 8,304,811 B2 * 11/2012 Zhang .................. H10D 30/015 257/E29.246
8,981,381 B2 3/2015 Lin
(Continued)

FOREIGN PATENT DOCUMENTS

CN 107968036 A 4/2018
CN 113241382 A 8/2021
(Continued)

OTHER PUBLICATIONS

Sunwoo Heo et al., Ternary Full Adder Using Multi-Threshold Voltage Graphene Barristors, IEEE Electron Device Letters, 39, Dec. 12, 2018.
(Continued)

*Primary Examiner* — Joseph C. Nicely
(74) *Attorney, Agent, or Firm* — Harness, Dickey & Pierce, P.L.C.

(57) ABSTRACT

Provided is an electronic device including a first lower material film, a first upper material film on the first lower material film, a first two-dimensional electron gas between the first lower material film and the first upper material film, a second lower material film on the first upper material film, a second upper material film on the second lower material film, a second two-dimensional electron gas between the
(Continued)

second lower material film and the second upper material film, a source electrode on the second upper material film, a drain electrode on the second upper material film, a gate insulating film on the second upper material film, and a gate electrode on the gate insulating film.

10 Claims, 27 Drawing Sheets

(51) Int. Cl.
*H10P 14/60* (2026.01)
*H10P 14/692* (2026.01)

(52) U.S. Cl.
CPC ......... *H10D 30/475* (2025.01); *H10D 64/691* (2025.01); *H10P 14/662* (2026.01); *H10P 14/69391* (2026.01); *H10P 14/69395* (2026.01)

(56) References Cited

U.S. PATENT DOCUMENTS

| | | | | |
|---|---|---|---|---|
| 9,680,001 | B2 | 6/2017 | Shibata et al. | |
| 10,133,550 | B2 | 11/2018 | Kim et al. | |
| 10,269,923 | B2 | 4/2019 | Chen et al. | |
| 11,081,577 | B2 | 8/2021 | Kim et al. | |
| 12,108,677 | B2 * | 10/2024 | Park | H10N 10/17 |
| 2002/0145161 | A1 | 10/2002 | Miura et al. | |
| 2014/0253183 | A1 * | 9/2014 | Holmes | H10D 62/80 327/109 |
| 2015/0303292 | A1 | 10/2015 | Shibata et al. | |
| 2017/0243967 | A1 * | 8/2017 | Kim | H01L 21/02554 |
| 2018/0108753 | A1 * | 4/2018 | Chen | H10D 62/824 |
| 2020/0373407 | A1 | 11/2020 | Shih et al. | |
| 2023/0097366 | A1 * | 3/2023 | Park | H01L 21/0228 257/76 |

FOREIGN PATENT DOCUMENTS

| | | | | | |
|---|---|---|---|---|---|
| JP | 2011-523218 | A | | 8/2011 | |
| JP | 2012094746 | A | | 5/2012 | |
| JP | 2016072499 | A | | 5/2016 | |
| JP | 6244557 | B2 | | 12/2017 | |
| KR | 101522819 | B1 | | 5/2015 | |
| KR | 101689159 | B1 | | 12/2016 | |
| KR | 101718077 | B1 | * | 3/2017 | H10D 30/00 |

OTHER PUBLICATIONS

Jae Won Jeong et al., Tunnelling-based ternary metalâ€"oxideâ€" semiconductor technology, Nature Electronics, 2, pp. 307-312 (2019).
Tae Jun Seok et al., Field-Effect Device Using Quasi-Two-Dimensional Electron Gas in Mass-Producible Atomic-Layer-Deposited Al2O3/TiO2 Ultrathin (<10 nm) Film Heterostructures, ACS Nano 2018.
Sung Min Kim et al., High-Performance, Transparent Thin Film Hydrogen Gas Sensor Using 2D Electron Gas at Interface of Oxide Thin Film Heterostructure Grown by Atomic Layer Deposition, Adv. Funct. Mater. 2018.
H. J. Lee, T. Moon, S. D. Hyun, S. Kang, C. S. Hwang, Characterization of a 2D Electron Gas at the Interface of Atomic-Layer Deposited Al2O3/ZnO Thin Films for a Field-Effect Transistor. Adv. Electron. Mater. 2021, 7, 2000876. https://doi.org/10.1002/aelm.202000876.

* cited by examiner

ELECTRONIC DEVICE

CROSS-REFERENCE TO RELATED APPLICATIONS

This U.S. non-provisional patent application claims priority under 35 U.S.C. § 119 of Korean Patent Application No. 10-2021-0127248, filed on Sep. 27, 2021 and Korean Patent Application No. 10-2022-0120371, filed on Sep. 22, 2022, the entire contents of which are hereby incorporated by reference.

BACKGROUND

The present disclosure relates to a multi-valued electronic device. More particularly, the present disclosure relates to a multi-valued electronic device including a high-concentration two-dimensional electron gas (2DEG) stacked device formed at an oxide heterojunction interface.

Two-dimensional electron gas is a form in which a high concentration of electrons of $10^{13}$/cm$^2$ to $10^{14}$/cm$^2$ exist at the interface between two materials, and moves freely in a direction parallel to the interface, but in a direction deviating from the interface, is confined in a region of several nm and has a limited movement. There have been many reports of electronic devices using a two-dimensional electron gas formed at the interface of a conventional semiconductor (e.g., AlGaAs/GaAs) and oxide (e.g., $LaAlO_3$/$SrTiO_3$) heterojunction as a channel, but since a single crystal substrate and a subsequent high-temperature process are required, commercialization and high integration are difficult in the application of current semiconductor process technology.

All current digital switching-based semiconductor devices are binary devices that have only two states, on and off, that is, 0 and 1, depending on the channel resistance state and have been developed in the direction of improving the device structure and integration in order to more efficiently process rapidly increasing information. However, with the advent of the 4th industrial revolution, simple physical improvement has reached its limit, and the demand for multi-valued logic devices having two or more states is increasing in order to overcome this. In particular, research on ternary system having three resistance states is being actively conducted and in the case of a typical method, an operation in the ternary system is attempted by constructing an additional circuit in a single binary device or by developing a new single device having unique characteristics by using a specific material as a channel. However, there is a limit to its application to an actual device in that circuit complexity is caused and conditions for material group and characteristic expression are limited in the development of a multi-valued logic device.

SUMMARY

The present disclosure provides a semiconductor device utilizing a two-dimensional electron gas channel at a non-single-crystal binary oxide heterojunction interface.

The present disclosure also provides a semiconductor device capable of controlling the operation of a two-dimensional electron gas channel by controlling the thickness of an oxide thin film.

The present disclosure also provides a stacked semiconductor device having two channels by stacking two-dimensional electron gas channels.

The present disclosure also provides a ternary multi-valued logic electronic device in which three multi-resistance states are induced by utilizing stacked two-dimensional electron gas channels.

The present disclosure also provides an electronic device with improved electrical performance and reliability.

The inventive concept provides a stacked binary oxide multi-valued device including two two-dimensional electron gas channels and an operating method thereof.

An embodiment of the inventive concept provides an electronic device including: a first lower material film; a first upper material film on the first lower material film; a first two-dimensional electron gas between the first lower material film and the first upper material film; a second lower material film on the first upper material film; a second upper material film on the second lower material film; a second two-dimensional electron gas between the second lower material film and the second upper material film; a source electrode on the second upper material film; a drain electrode on the second upper material film; a gate insulating film on the second upper material film; and a gate electrode on the gate insulating film, wherein a thickness of the first upper material film is at least 0.5 times a thickness of the second upper material film.

An embodiment of the inventive concept provides an electronic device including: a first lower material film; a first upper material film on the first lower material film; a first two-dimensional electron gas between the first lower material film and the first upper material film; a second lower material film on the first upper material film; a second upper material film on the second lower material film; a second two-dimensional electron gas between the second lower material film and the second upper material film; a source electrode on the second upper material film; a drain electrode on the second upper material film; a gate insulating film on the second upper material film; and a gate electrode on the gate insulating film, wherein the first two-dimensional electron gas is turned off when a magnitude of a potential difference between the gate electrode and the source electrode becomes greater than a magnitude of a first threshold voltage, wherein the second two-dimensional electron gas is turned off when a magnitude of a potential difference between the gate electrode and the source electrode becomes greater than a magnitude of the second threshold voltage, wherein a magnitude of the first threshold voltage is greater than a magnitude of the second threshold voltage.

In an electronic device according to some embodiments, the second two-dimensional electron gas and the first two-dimensional electron gas may be sequentially turned off by a difference between the magnitude of the first threshold voltage and the magnitude of the second threshold voltage.

In an electronic device according to some embodiments, the electronic device may operate in a "logic 2" state in which the first and second two-dimensional electron gases are both on, a "logic 1" state in which the first two-dimensional electron gas is on and the second two-dimensional electron gas is off, or a "logic 0" state in which the first and second two-dimensional electron gases are both off.

In an electronic device according to some embodiments, the magnitudes of the first and second threshold voltages may increase or decrease according to the thicknesses of the first and second upper material films.

An embodiment of the inventive concept provides an electronic device including: a first lower material film; a first upper material film on the first lower material film; a first two-dimensional electron gas between the first lower material film and the first upper material film; a second lower material film on the first upper material film; a second upper material film on the second lower material film; a second two-dimensional electron gas between the second lower material film and the second upper material film; a source electrode on the second upper material film; a drain electrode on the second upper material film; a gate insulating film on the second upper material film; and a gate electrode on the gate insulating film, wherein the first upper material film and the second upper material film include aluminum oxide, wherein a thickness of the second upper material film is 1.5 nm or more.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Hereinafter, a laminate structure and a manufacturing method thereof according to embodiments of the inventive concept will be described in detail with reference to the drawings.

Figure 1:
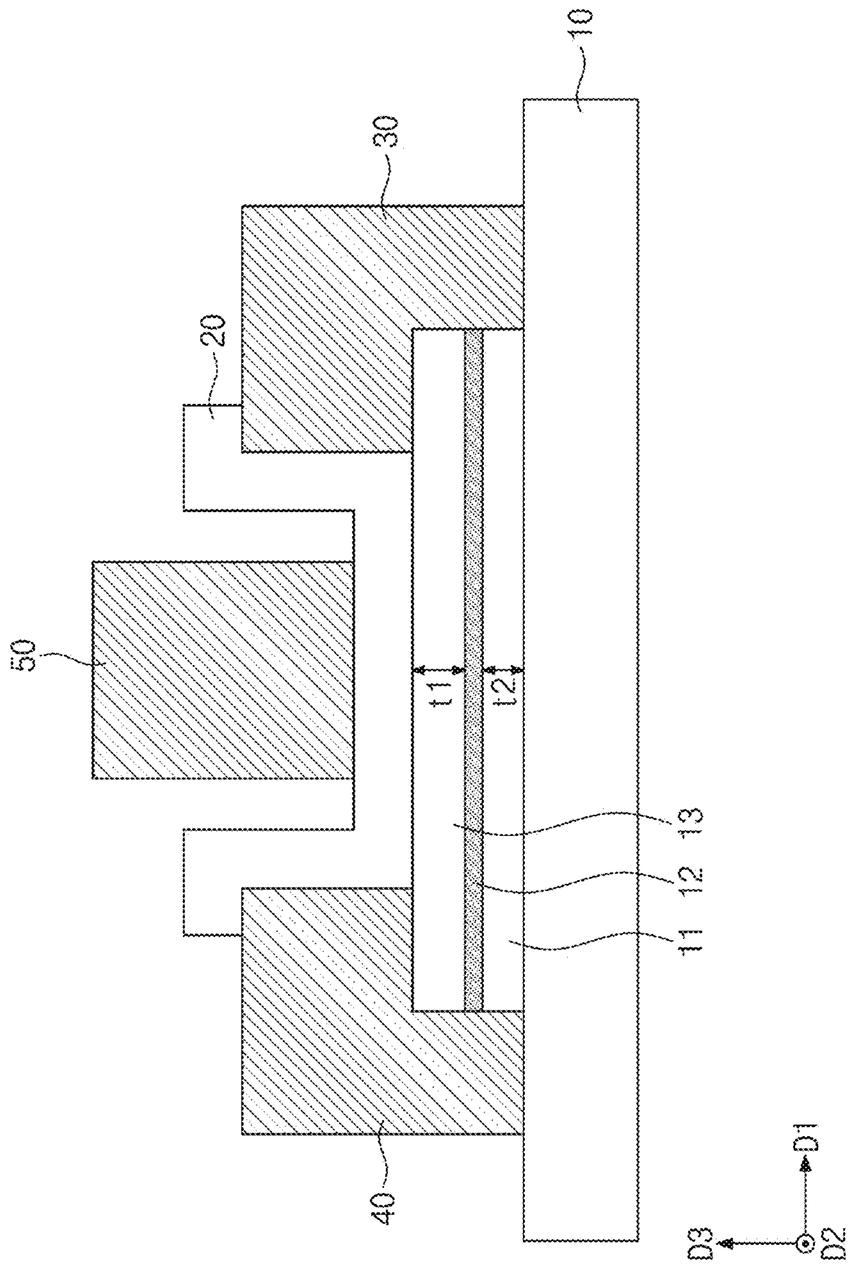
FIG. 1 is a cross-sectional view of an electronic device according to a first embodiment.

FIG. 1 is a cross-sectional view of an electronic device according to a first embodiment.

Referring to FIG. 1, the electronic device may include a substrate 10, a lower material film 11 on the substrate 10, an upper material film 13 on the lower material film 11, a two-dimensional electron gas 12 between the lower material film 11 and the upper material film 13, a source electrode 30 on the upper material film 13, a drain electrode 40 on the upper material film 13, a gate insulating film 20 on the upper material film 13, and a gate electrode 50 on the gate insulating film 20.

The electronic device may be a normally-on transistor using the two-dimensional electron gas 12 as a channel Depending on the voltage applied to the gate electrode 50, electrons in the two-dimensional electron gas 12 may be scattered, and the two-dimensional electron gas 12 channel may be turned off.

The substrate 100 may have a plate shape extending along a plane defined by the first direction D1 and the second direction D2. The first direction D1 and the second direction D2 may cross each other. For example, the first direction D1 and the second direction D2 may be horizontal directions orthogonal to each other.

The substrate 100 may include an insulating material. For example, the substrate 100 may include silicon oxide ($SiO_2$) In some embodiments, the substrate 100 may be a silicon substrate including a silicon oxide film.

A two-dimensional electron gas 12 may be provided between the lower material film 11 and the upper material film 13. The two-dimensional electron gas 12 may be formed by a reduction reaction on the surface of the lower material film 11 between the deposition processes of the upper material film 13.

The lower material film 11 and the upper material film 13 may contain materials that cause the two-dimensional electron gas 12 to form at the interface of the lower material film 11 and the upper material film 13. The lower material film 11 and the upper material film 13 may include different materials. For example, the lower material film 11 may include zinc oxide (ZnO). For example, the upper material film 13 may include aluminum oxide ($Al_2O_3$), hafnium oxide ($HfO_2$), or zinc sulfide (ZnS).

The thickness t1 of the upper material film 13 may be 1.5 nm or more. When the thickness t1 of the upper material film 13 is less than 1.5 nm, the sheet resistance increases so that the two-dimensional electron gas 12 may not be formed.

The thickness t1 of the upper material film 13 may be the thickness in the third direction D3 of the upper material film 13. The third direction D3 may intersect the first direction D1 and the second direction D2. For example, the third direction D3 may be a vertical direction perpendicular to the first direction D1 and the second direction D2.

The thickness t2 of the lower material film 11 may be 2.5 nm to 6 nm. When the thickness t2 of the lower material film 11 is less than 2.5 nm, the two-dimensional electron gas 12 may not be formed between the lower material film 11 and the upper material film 13. When the thickness t2 of the lower material film 11 is 6 nm or more, the conductivity of the lower material film 11 may be relatively large, and the electronic device may not operate as a transistor. The thickness t2 of the lower material film 11 may be the thickness in the third direction D3 of the lower material film 11.

The gate insulating film 20 may be in contact with the upper surface of the upper material film 13. The gate insulating film 20 may contact the sidewall of the source electrode 30 and the sidewall of the drain electrode 40. The gate insulating film 20 may include an insulating material. For example, the gate insulating film 20 may include hafnium oxide ($HfO_2$) The thickness of the gate insulating film 20 may be, for example, 6 nm.

The source electrode 30 and the drain electrode 40 may be in contact with the upper surface of the upper material film 13. The source electrode 30, the drain electrode 40, and the gate electrode 50 may include conductive materials. For example, the source electrode 30 and the drain electrode 40 may include titanium (Ti), and the gate electrode 50 may include chromium (Cr).

The source electrode 30 may be in ohmic contact with the two-dimensional electron gas 12. The drain electrode 40 may be in ohmic contact with the two-dimensional electron gas 12.

Figure 2A:
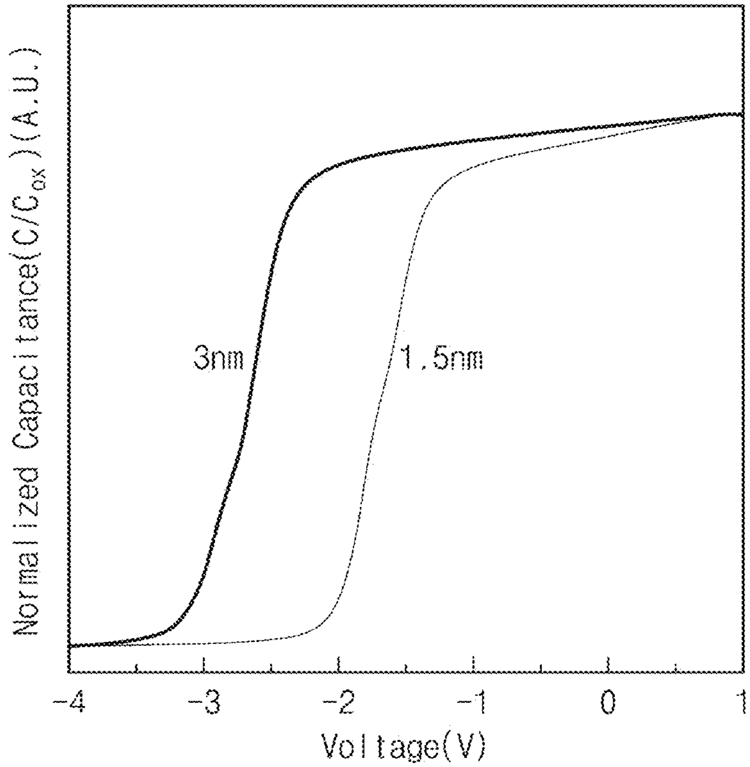
FIGS. 2A and 2B are graphs for explaining electrical characteristics of an electronic device according to Preparation Example 1 and an electronic device according to Preparation Example 2.
Figure 2B:
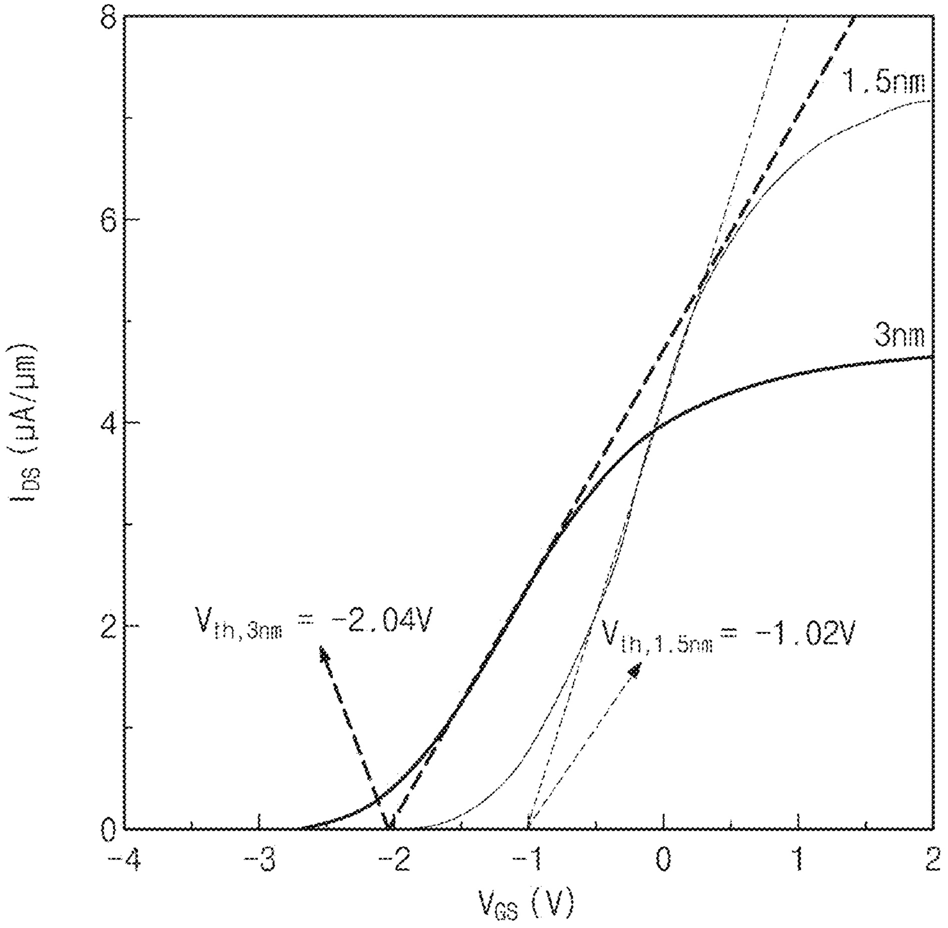
Figure 3A:
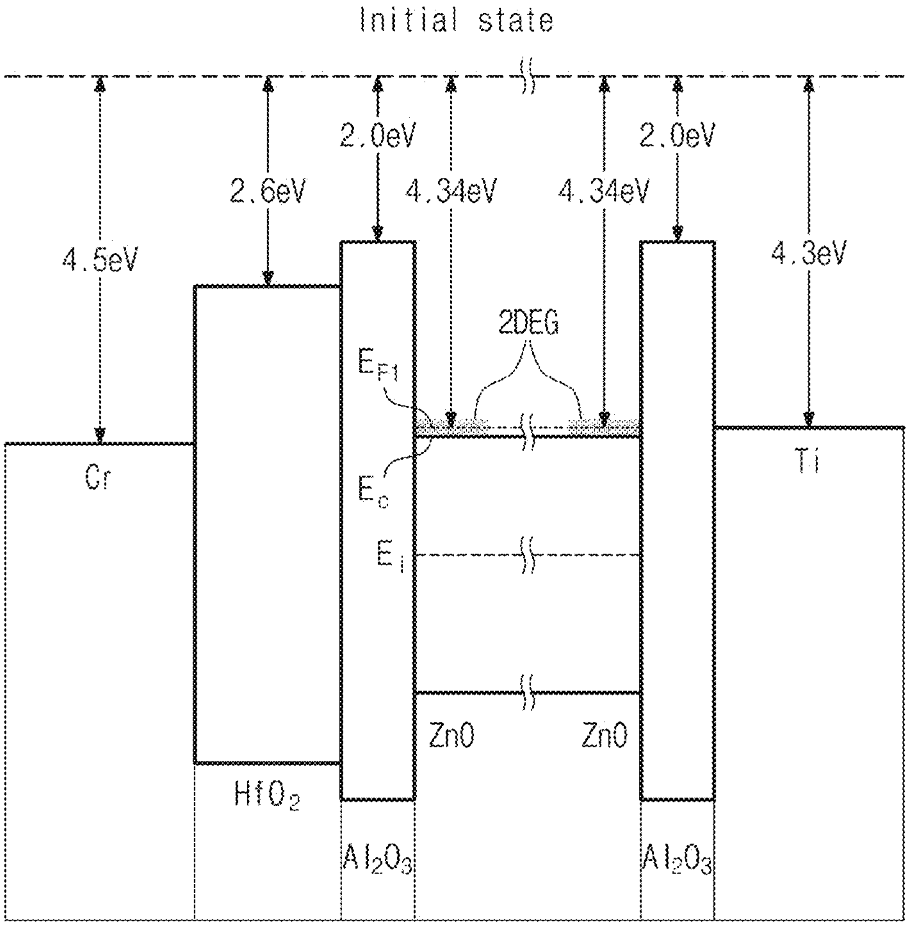
FIGS. 3A, 3B and 3C are energy band diagrams of an electronic device according to Preparation Example 1.
Figure 3B:
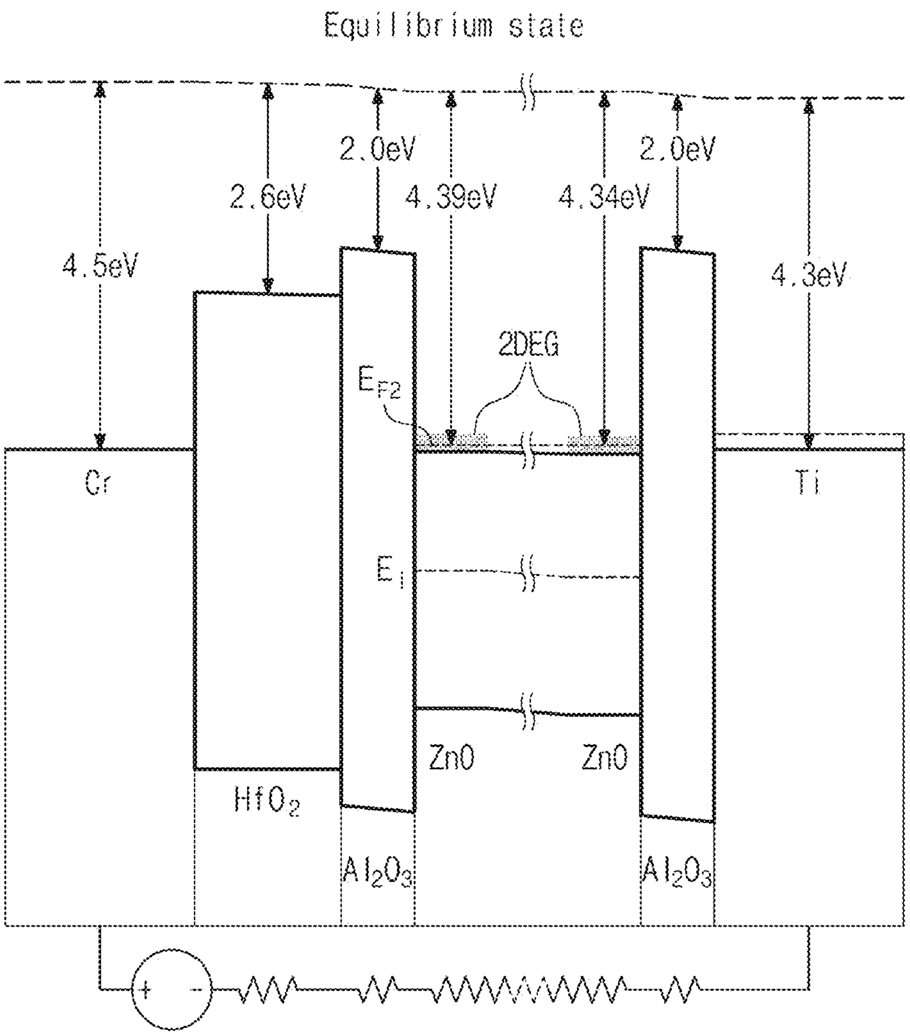
Figure 3C:
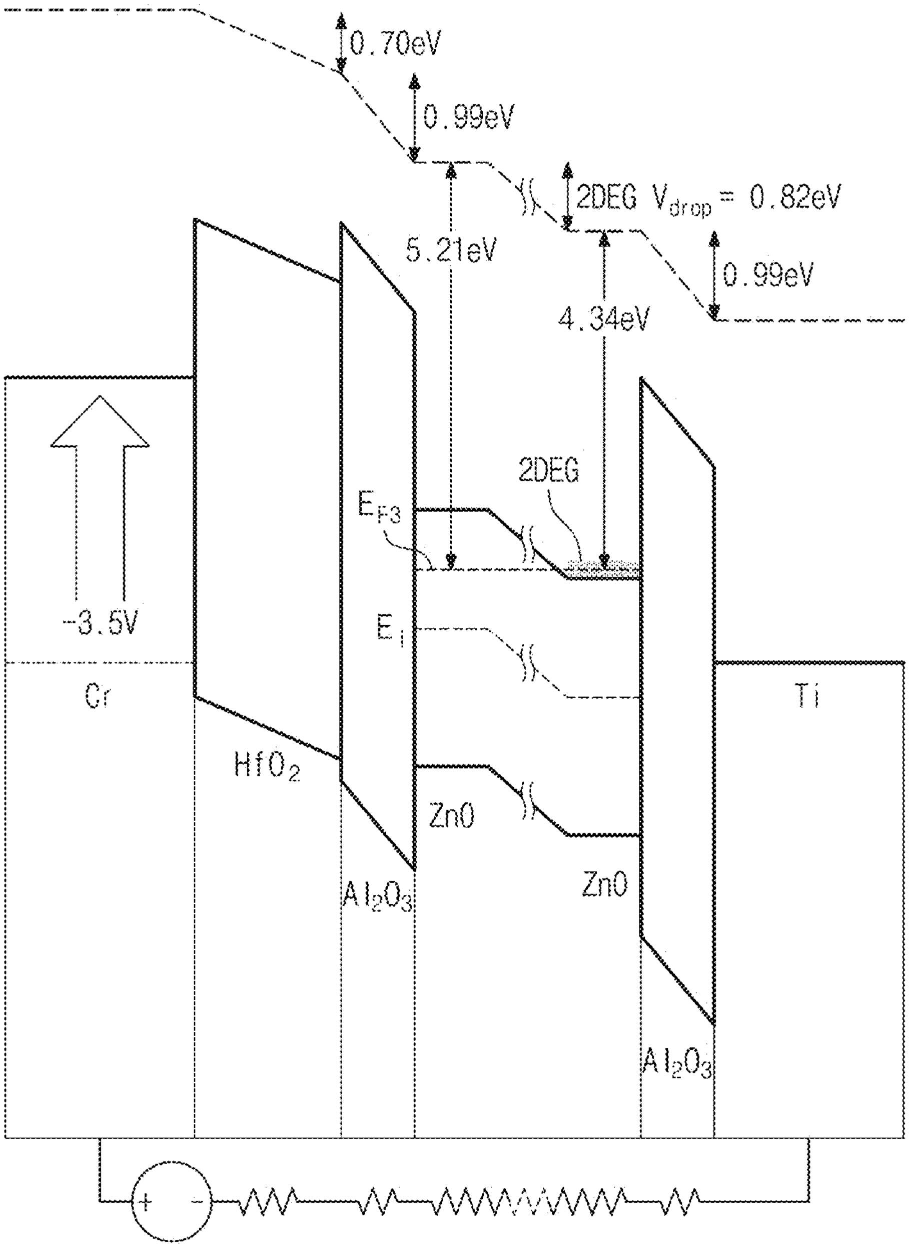
Figure 4A:
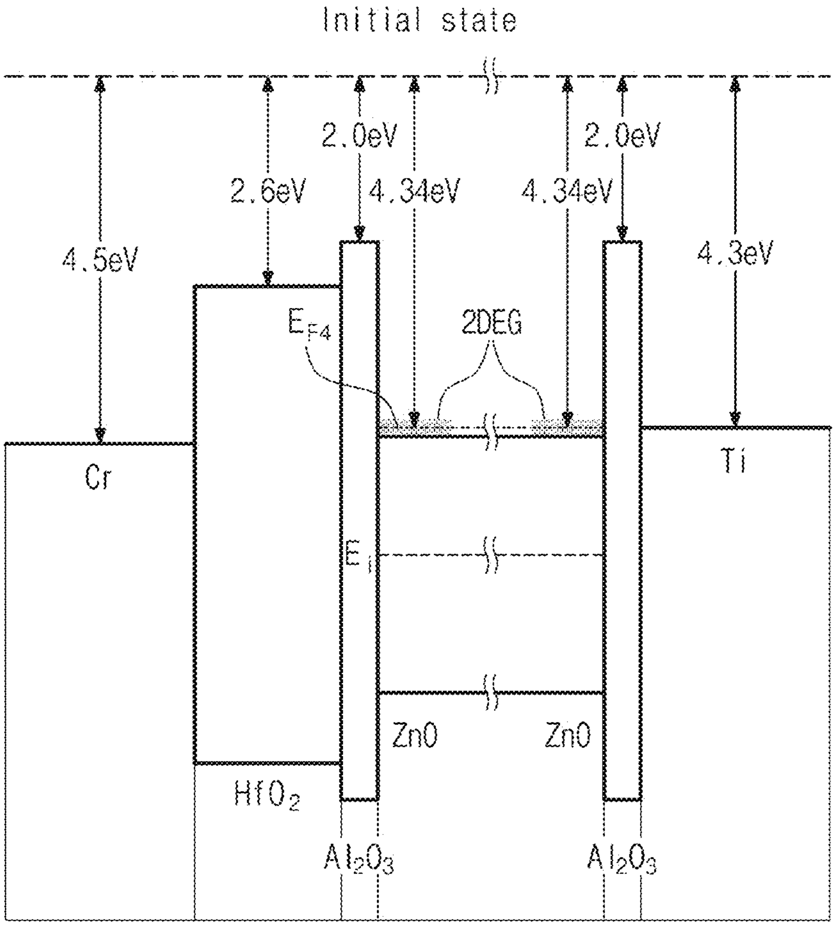
FIGS. 4A, 4B and 4C are energy band diagrams of an electronic device according to Preparation Example 2.
Figure 4B:
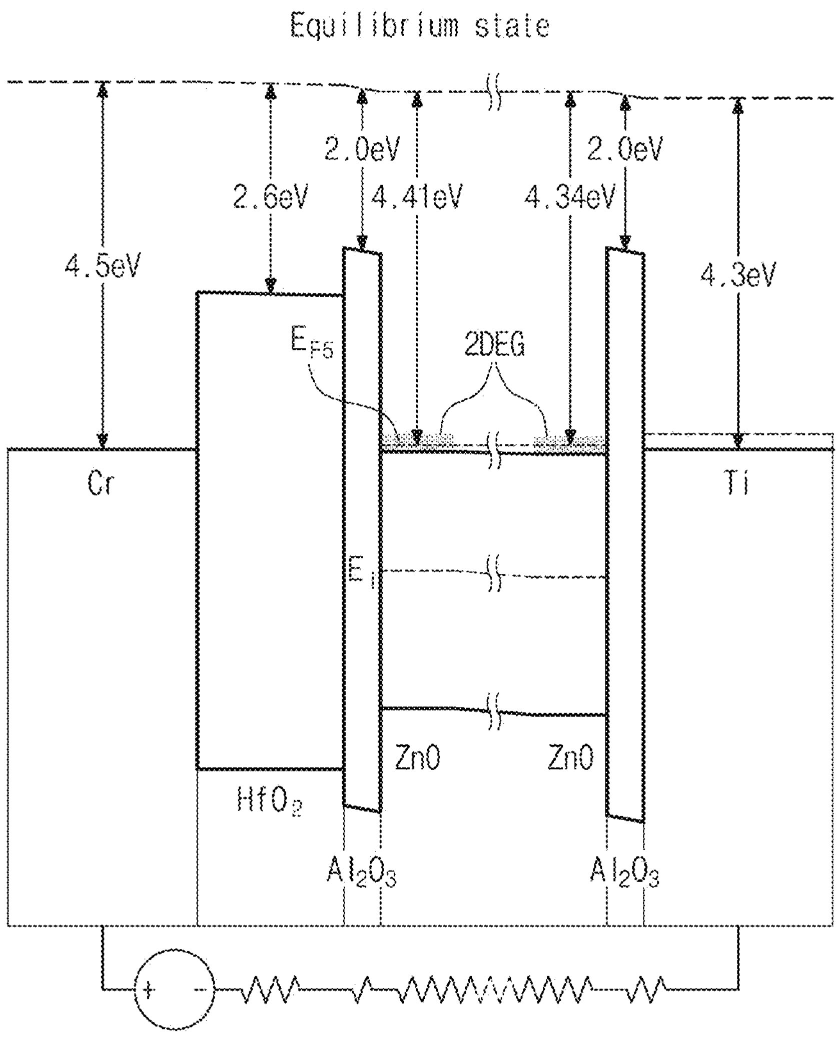
Figure 4C:
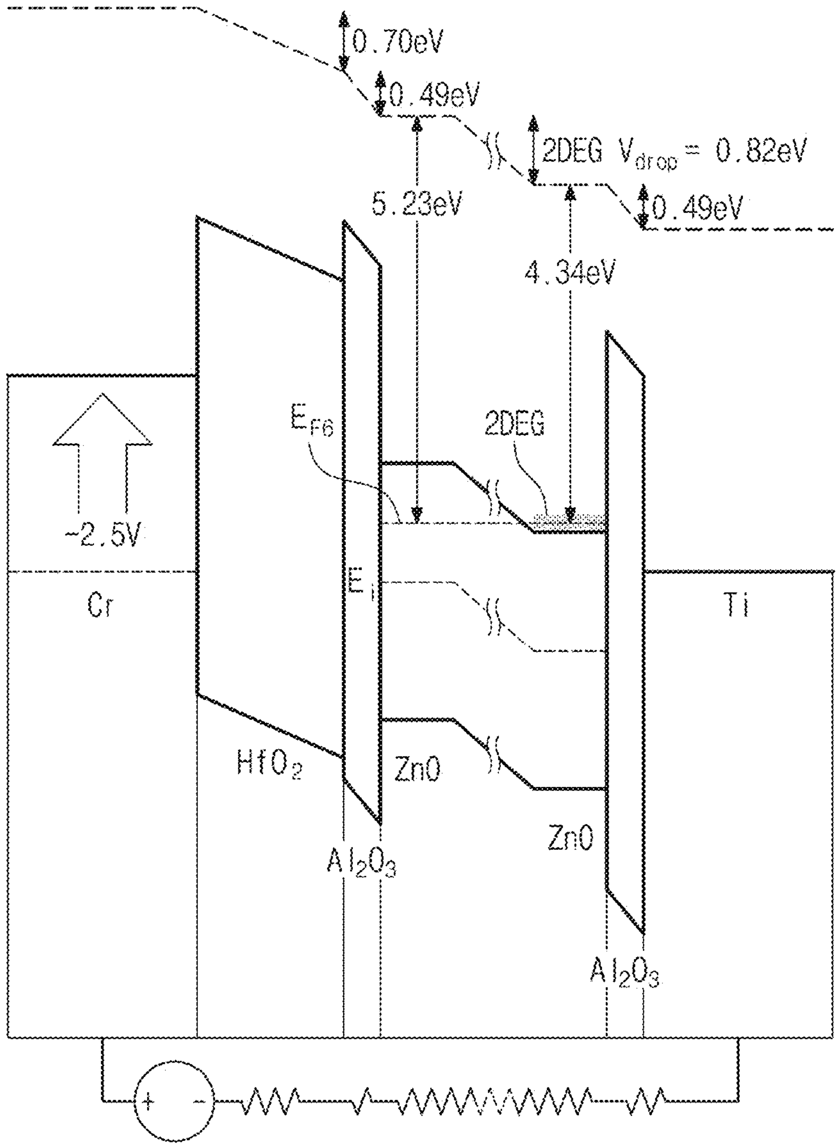

FIGS. 2A and 2B are graphs for explaining electrical characteristics of the electronic device according to Preparation Example 1 and the electronic device according to Preparation Example 2. FIGS. 3A, 3B and 3C are energy band diagrams of an electronic device according to Preparation Example 1. FIGS. 4A, 4B and 4C are energy band diagrams of an electronic device according to Preparation Example 2.

According to the electronic device of FIG. 1, an electronic device according to Preparation Example 1 and an electronic device according to Preparation Example 2 were manufactured. The electronic device according to Preparation Example 1 and the electronic device according to Preparation Example 2 were manufactured such that the gate insulating film contains $HfO_2$ and has a thickness of 6 nm, the lower material film contains ZnO and has a thickness of 3 nm, the gate electrode contains Cr, the source electrode and the drain electrode contain Ti, the substrate contains $SiO_2$, and the upper material film contains $Al_2O_3$.

The electronic device according to Preparation Example 1 was manufactured so that the thickness of the upper material film was 3 nm. The electronic device according to Preparation Example 2 was manufactured so that the thickness of the upper material film was 1.5 nm.

Referring to FIG. 2A, in the electronic device according to Preparation Example 1 and the electronic device according to Preparation Example 2, a normalized capacitance according to a voltage applied to the gate electrode was measured. Compared to Preparation Example 1, it was confirmed that the flat band voltage $V_{FB}$ was shifted by approximately (+)1 V in Preparation Example 2. In Preparation Example 1 and Preparation Example 2, it was confirmed that when a negative voltage was applied, the capacitance converges to 0, resulting in full depletion characteristics.

Referring to FIG. 2B, when the drain-source potential difference $V_{DS}$ was 2 V, the drain-source current $I_{Ds}$ of the electronic device according to Preparation Example 1 and the electronic device according to Preparation Example 2 was measured. It was confirmed that the electronic device according to Preparation Example 2 had a relatively high on-current characteristic due to a lower contact resistance than the electronic device according to Preparation Example 1. It was confirmed that the threshold voltage $V_{th}$ of the electronic device according to Preparation Example 1 was −2.04 V, and it was confirmed that the threshold voltage $V_{th}$ of the electronic device according to Preparation Example 2 was −1.02 V.

Electrical characteristics of the electronic device according to Preparation Example 1 and the electronic device according to Preparation Example 2 were measured as shown in [Table 1] below. In [Table 1] below, $I_{on}$, $I_{off}$, $I_{on}/I_{off}$, and SS were measured under the condition that the gate-source potential difference $V_{GS}$ was 2 V and the magnitude of the drain-source potential difference Vim was 2 V.

TABLE 1

| | Preparation Example 1 | Preparation Example 2 |
|---|---|---|
| $I_{on}$ (μA/μm) | 4.735 | 7.167 |
| $I_{off}$ (μA/μm) | $1.06 \times 10^{-7}$ | $1.02 \times 10^{-7}$ |
| $I_{on}/I_{off}$ | $\sim 4.5 \times 10^{7}$ | $\sim 7.0 \times 10^{7}$ |
| $V_{th}$ (V) | −2.04 | −1.02 |
| SS (mV/dec.) | 150.4 | 131.8 |

As described above, it was confirmed that as the thickness of the upper material film decreased, the contact resistance between the source electrode and the two-dimensional electron gas decreased, and the voltage drop $V_{drop}$ due to the resistance of the upper material film decreased. It was confirmed that the threshold voltage $V_{th}$ may be adjusted according to the thickness control of the upper material film. It was confirmed that the switching speed increased (i.e., SS decreased) as the thickness of the upper material film decreased.

In FIG. 3A, an energy band of an initial state of an electronic device according to Preparation Example 1 is shown. In FIG. 3B, an energy band in an equilibrium state of the electronic device according to Preparation Example 1 is shown. In FIG. 3C, the energy band of the electronic device according to Preparation Example 1 when −3.5 V is applied to the Cr gate electrode is shown.

Referring to FIG. 3A, in the initial state where the Cr gate electrode and the Ti source electrode are not connected by a circuit, based on that the electron affinity of the ZnO lower material film is 4.4 eV and a difference between the conduction band energy level $E_c$ of the ZnO lower material film and the initial state Fermi energy level ($E_{F1}$) of the ZnO lower material film is −0.06 eV (i.e., $E_c - E_{F1} = -0.06$ eV), the work function of the two-dimensional electron gas 2DEG was calculated to be 4.34 eV.

Referring to FIG. 3B, in the equilibrium state in which the Cr gate electrode and the Ti source electrode are connected by a circuit, the Fermi energy levels of the Cr gate electrode and the Ti source electrode are aligned, and accordingly, the initial state Fermi energy level $E_{F1}$ of the ZnO lower material film adjacent to the Cr gate electrode is downward to the equilibrium state Fermi energy level $E_{F2}$. Based on the dielectric constant of ZnO lower material film, $HfO_2$ gate insulating film and $Al_2O_3$ upper material film, the change in the Fermi energy level of the ZnO lower material film adjacent to the Cr gate electrode was calculated to be 0.05 eV (i.e., $E_{F1} - E_{F2} = 0.05$ eV). Accordingly, the work function of the two-dimensional electron gas 2DEG adjacent to the Cr gate electrode was calculated to be 4.39 eV, which increased by 0.05 eV.

In contrast, the work function of the two-dimensional electron gas 2DEG adjacent to the Ti source electrode was the same as the initial state.

Referring to FIG. 3C, when −3.5 V is applied to the Cr gate electrode, the change in the Fermi energy level of the ZnO lower material film adjacent to the Cr gate electrode was calculated to be 0.82 eV (i.e., $E_{F2}-E_{F3}$=0.82 eV). Accordingly, the work function of the two-dimensional electron gas 2DEG adjacent to the Cr gate electrode was calculated to be 5.21 eV, which increased by 0.82 eV. The carrier density at this time was approximately $2.76*10^6/cm^3$, which was confirmed to be similar to intrinsic ZnO. It was confirmed that the two-dimensional electron gas 2DEG channel was turned off adjacent to the Cr gate electrode by the negative voltage applied to the Cr gate electrode.

In contrast, the work function of the two-dimensional electron gas 2DEG adjacent to the Ti source electrode was the same as the initial state.

In FIG. 4A, an energy band of an initial state of an electronic device according to Preparation Example 2 is shown. In FIG. 4B, an energy band in an equilibrium state of the electronic device according to Preparation Example 2 is shown. In FIG. 4C, the energy band of the electronic device according to Preparation Example 2 when −2.5 V is applied to the Cr gate electrode is shown.

4A and 4B, in the equilibrium state, the initial state Fermi energy level $E_{F4}$ of the ZnO lower material film adjacent to the Cr gate electrode is downward to the equilibrium state Fermi energy level $E_{F5}$. Based on the dielectric constant of ZnO lower material film, $HfO_2$ gate insulating film and $Al_2O_3$ upper material film, the change in the Fermi energy level of the ZnO lower material film adjacent to the Cr gate electrode was calculated to be 0.07 eV (i.e., $E_{F4}-E_{F5}$=0.07 eV). Accordingly, the work function of the two-dimensional electron gas 2DEG adjacent to the Cr gate electrode was calculated to be 4.41 eV, which increased by 0.07 eV. Compared with the electronic device according to Preparation Example 1, in the electronic device according to Preparation Example 2, it was confirmed that the change in the Fermi energy level of the ZnO lower material film adjacent to the Cr gate electrode increased.

Referring to FIG. 4C, when −2.5 V is applied to the Cr gate electrode, the change in the Fermi energy level of the ZnO lower material film adjacent to the Cr gate electrode was calculated to be 0.82 eV (i.e., $E_{F5}-E_{F6}$=0.82 eV). Accordingly, it was confirmed that a voltage required to induce the same energy band state as when −3.5 V is applied to the electronic device according to Preparation Example 1 (FIG. 3C) was 1 V less in the electronic device according to Preparation Example 2, theoretically, and it was confirmed that the threshold voltage was shifted.

As described above, as the thickness of the upper material film of the electronic device according to Preparation Example 2 is thinner than the upper material film of the electronic device according to Preparation Example 1, it was confirmed that the voltage drop in the upper material film is reduced, and the degree of change in the work function of the electronic device according to Preparation Example 2 is larger. It was confirmed that the voltage applied to the gate electrode to turn off the two-dimensional electron gas channel was smaller in the electronic device according to Preparation Example 2 than in the electronic device according to Preparation Example 1. As a result, it was verified that the voltage drop due to the resistance of the upper material film may be controlled according to the thickness of the upper material film, and it was verified that the threshold voltage of the two-dimensional electron gas channel may be adjusted.

Figure 5A:
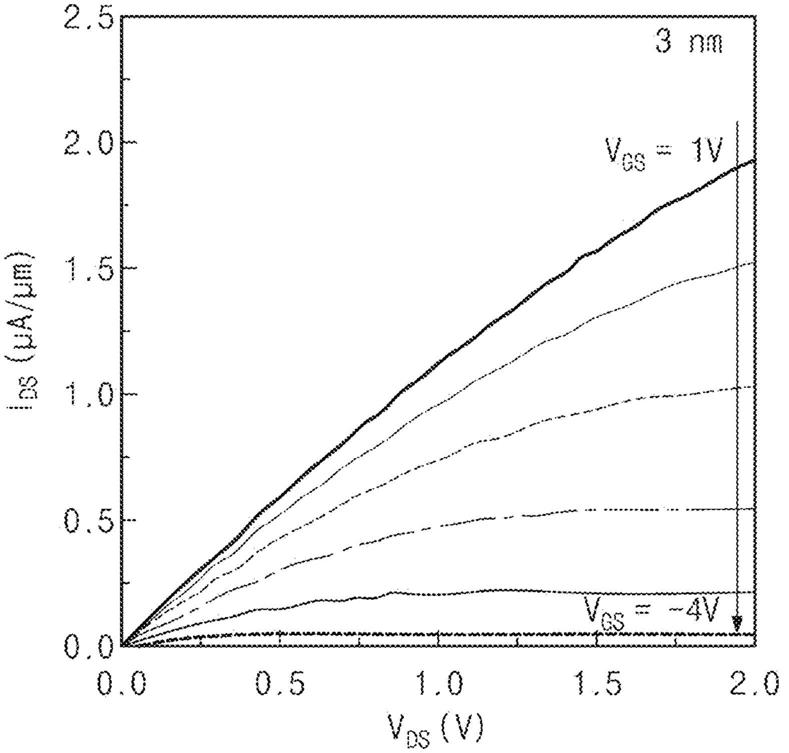
FIGS. 5A and 5B are graphs for explaining an ohmic contact of an electronic device according to Preparation Example 1 and an electronic device according to Preparation Example 2.
Figure 5B:
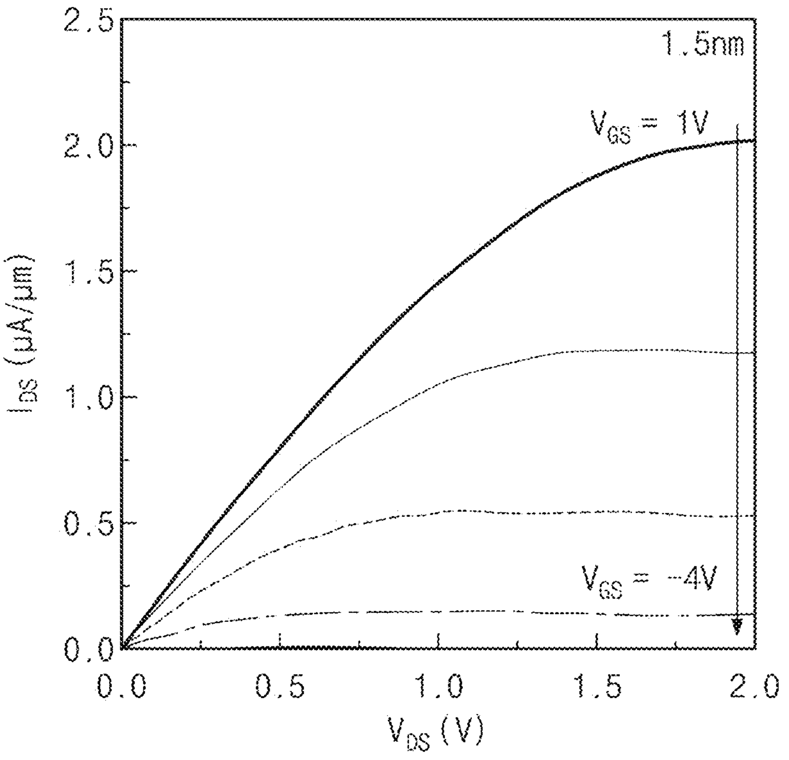

FIGS. 5A and 5B are graphs for explaining an ohmic contact of an electronic device according to Preparation Example 1 and an electronic device according to Preparation Example 2.

Referring to FIG. 5A, the drain-source current $I_{DS}$ according to the drain-source potential difference $V_{DS}$ of the electronic device according to Preparation Example 1 was measured. The drain-source current $I_{DS}$ was measured while decreasing the gate-source potential difference $V_{GS}$ from 1 V to −4 V. With the gate-source potential difference $V_{GS}$ condition in which the two-dimensional electron gas channel is on, it was confirmed that the drain-source current $I_{DS}$ linearly increased as the drain-source potential difference $V_{DS}$ increased in a region where the drain-source potential difference $V_{DS}$ was relatively small, such that this proves that the source and drain electrodes and the two-dimensional electron gas form an ohmic contact.

Referring to FIG. 5B, the drain-source current $I_{DS}$ according to the drain-source potential difference $V_{DS}$ of the electronic device according to Preparation Example 2 was measured. The drain-source current $I_{DS}$ was measured while decreasing the gate-source potential difference $V_{GS}$ from 1 V to −4 V. With the gate-source potential difference $V_{GS}$ condition in which the two-dimensional electron gas channel is on, it was confirmed that the drain-source current $I_{DS}$ linearly increased as the drain-source potential difference $V_{DS}$ increased in a region where the drain-source potential difference $V_{DS}$ was relatively small, such that this proves that the source and drain electrodes and the two-dimensional electron gas form an ohmic contact.

FIGS. 6A, 6B, 6C, and 6D are graphs showing the sheet resistance of the heterojunction structure.

Figure 6A:
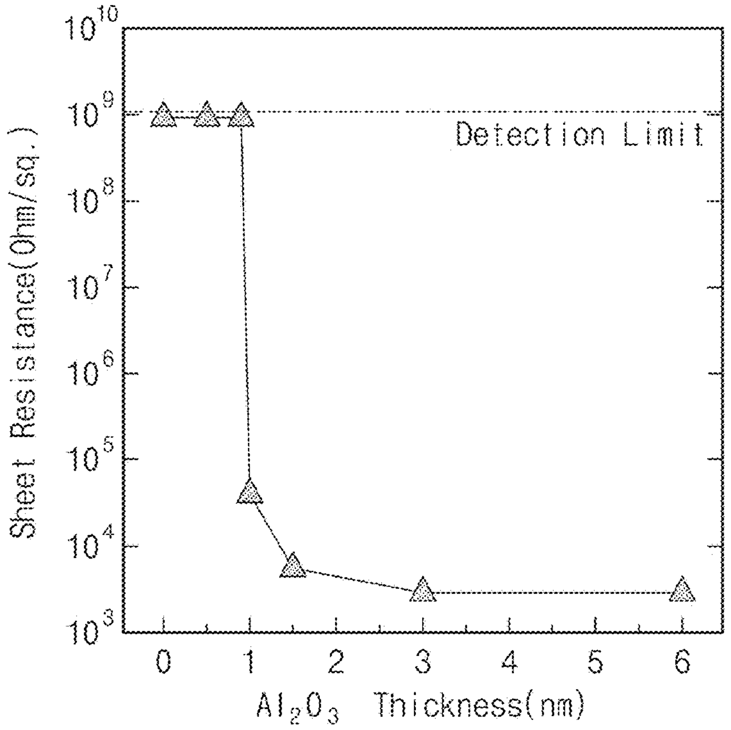
FIGS. 6A, 6B, 6C, and 6D are graphs showing the sheet resistance of the heterojunction structure.

Referring to FIG. 6A, a plurality of first heterojunction structures were manufactured. First heterojunction structures were manufactured so that each of the first heterojunction structures included a $SiO_2$ substrate, a ZnO lower material film having a thickness of 5 nm on the $SiO_2$ substrate, and an $Al_2O_3$ upper material film on the ZnO lower material film. First heterojunction structures were manufactured so that the thicknesses of $Al_2O_3$ upper material films of the first heterojunction structures were different.

As a result of measuring the sheet resistance of the first heterojunction structures, it was confirmed that the sheet resistance was rapidly reduced at the thickness of the $Al_2O_3$ upper material film of 1 nm or more. Accordingly, it was proved that a two-dimensional electron gas was formed when the thickness of the $Al_2O_3$ upper material film was 1 nm or more. When forming $Al_2O_3$ upper material films, the surface of the ZnO lower material film may be reduced by the highly reducing precursor trimethylaluminum (TMA), oxygen vacancy may be formed by the surface reduction reaction to form a two-dimensional electron gas.

Figure 6B:
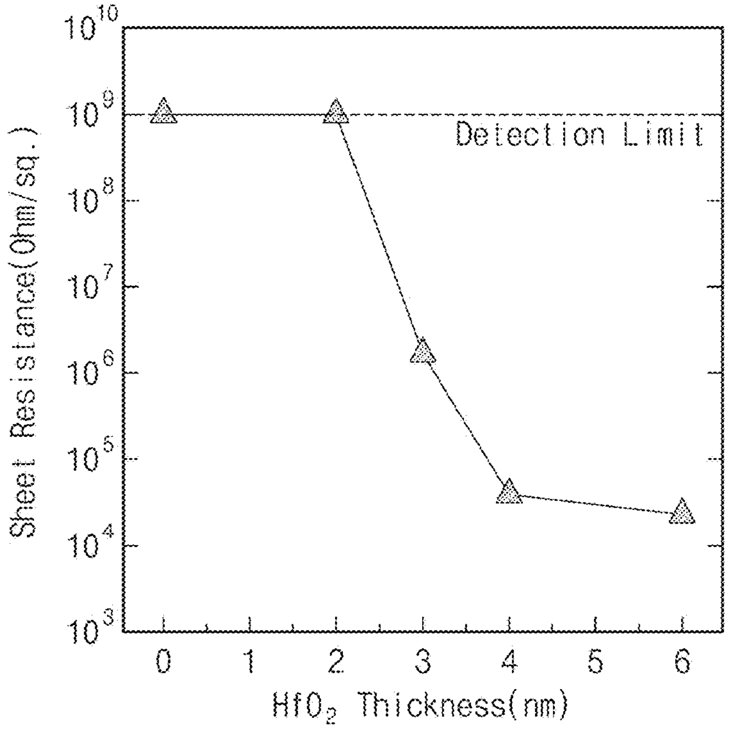

Referring to FIG. 6B, a plurality of second heterojunction structures were manufactured. Second heterojunction structures were manufactured so that each of the second heterojunction structures included a $SiO_2$ substrate, a ZnO lower material film having a thickness of 5 nm on the $SiO_2$ substrate, and an $HfO_2$ upper material film on the ZnO lower material film. Second heterojunction structures were manufactured so that the thicknesses of the $HfO_2$ upper material films of the second heterojunction structures were different.

As a result of measuring the sheet resistance of the second heterojunction structures, it was confirmed that the sheet resistance was rapidly reduced at the thickness of the $HfO_2$ upper material film of 4 nm or more. Accordingly, it was proved that a two-dimensional electron gas was formed when the thickness of the $HfO_2$ upper material film was 4 nm or more. Since the reducing power of the precursor [Tetrakis (ethylmethylamido)hafnium(IV)] (TEMAHf) injected when forming the $HfO_2$ upper material film is lower than that of trimethylaluminum (TMA), two-dimensional electron gas may be formed in the relatively less abrupt sheet resistance reduction behavior and thick $HfO_2$ upper material film.

Figure 6C:
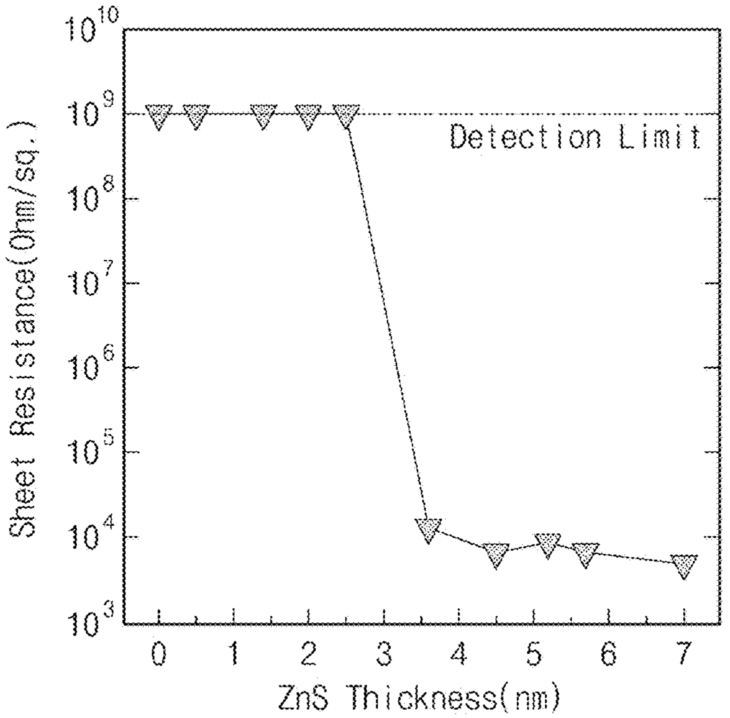

Referring to FIG. 6C, a plurality of third heterojunction structures were manufactured. Third heterojunction structures were manufactured so that each of the third heterojunction structures included a $SiO_2$ substrate, a ZnO lower material film having a thickness of 5 nm on the $SiO_2$ substrate, and a ZnS upper material film on the ZnO lower material film. Third heterojunction structures were manufactured so that the thicknesses of the ZnS upper material films of the third heterojunction structures were different.

As a result of measuring the sheet resistance of the third heterojunction structures, it was confirmed that the sheet resistance was rapidly reduced at the thickness of the ZnS upper material film of 3.5 nm or more. Accordingly, it was proved that a two-dimensional electron gas was formed when the thickness of the ZnS upper material film was 3.5 nm or more. A two-dimensional electron gas may be formed by reducing precursor diethylzinc (DEZ) injected when the ZnS upper material film is formed.

Figure 6D:
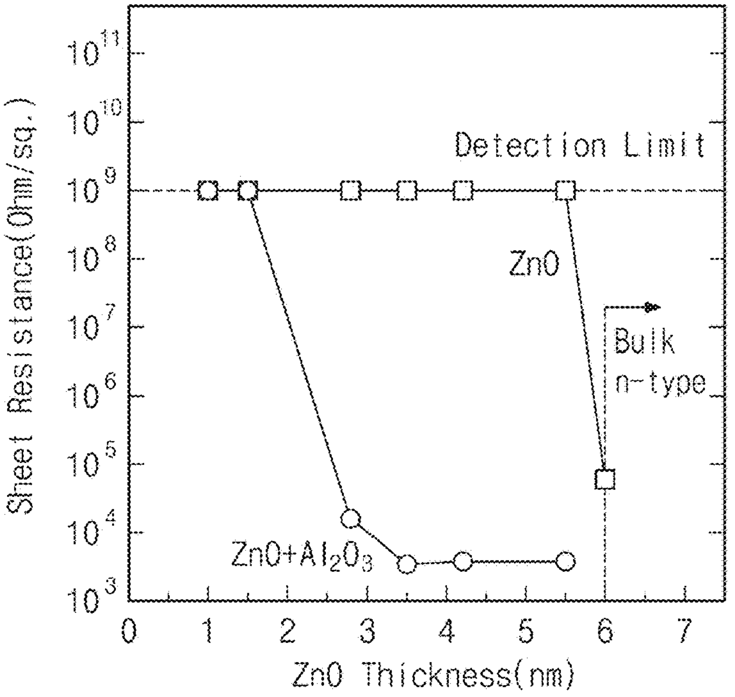

Referring to FIG. 6D, a plurality of fourth heterojunction structures and a plurality of fifth heterojunction structures were manufactured. Fourth heterojunction structures were manufactured such that each of the fourth heterojunction structures included a ZnO material film on a $SiO_2$ substrate. Fourth heterojunction structures were manufactured so that the thicknesses of the ZnO material films of the fourth heterojunction structures were different. Fifth heterojunction structures were manufactured so that each of the fifth heterojunction structures included a $SiO_2$ substrate, a ZnO lower material film on the $SiO_2$ substrate, and an $Al_2O_3$ upper material film having a thickness of 3 nm on the ZnO lower material film. Fifth heterojunction structures were manufactured so that the thicknesses of the ZnO lower material films of the fifth heterojunction structures were different.

As a result of measuring the sheet resistance of the fourth heterojunction structures, it was confirmed that the sheet resistance was rapidly reduced at the thickness of the ZnO material film of 6 nm or more. Accordingly, when the thickness of the ZnO material film is 6 nm or more, bulk n-type characteristics are expressed, which proves that the ZnO material film itself has conductivity and it is impossible to determine whether a two-dimensional electron gas is formed.

As a result of measuring the sheet resistance of the fifth heterojunction structures, it was confirmed that the sheet resistance was rapidly increased at the thickness of the ZnO lower material film of less than 2.5 nm. Accordingly, it was proved that the two-dimensional electron gas was not formed when the thickness of the ZnO lower material film was less than 2.5 nm.

Figure 7A:
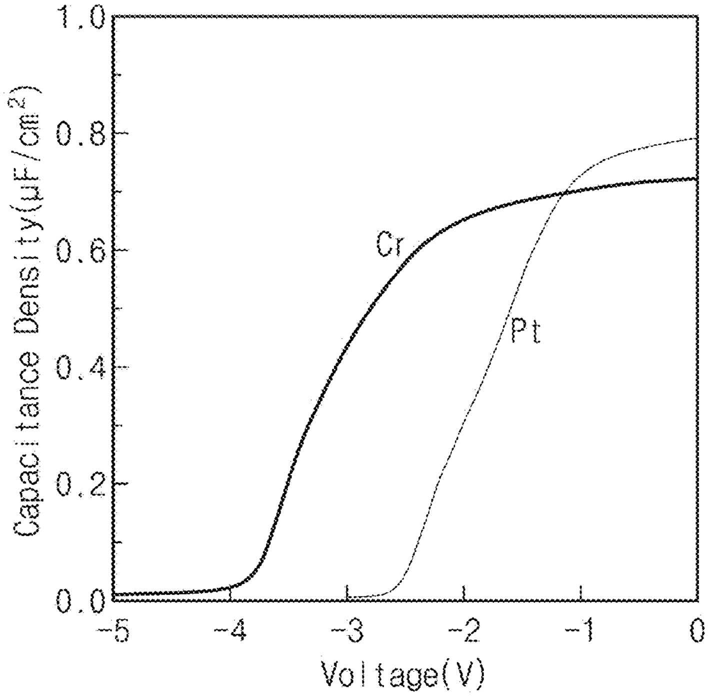
FIGS. 7A and 7B are graphs for explaining electrical characteristics of an electronic device according to Preparation Example 1, an electronic device according to Preparation Example 3, and an electronic device according to Preparation Example 4.
Figure 7B:
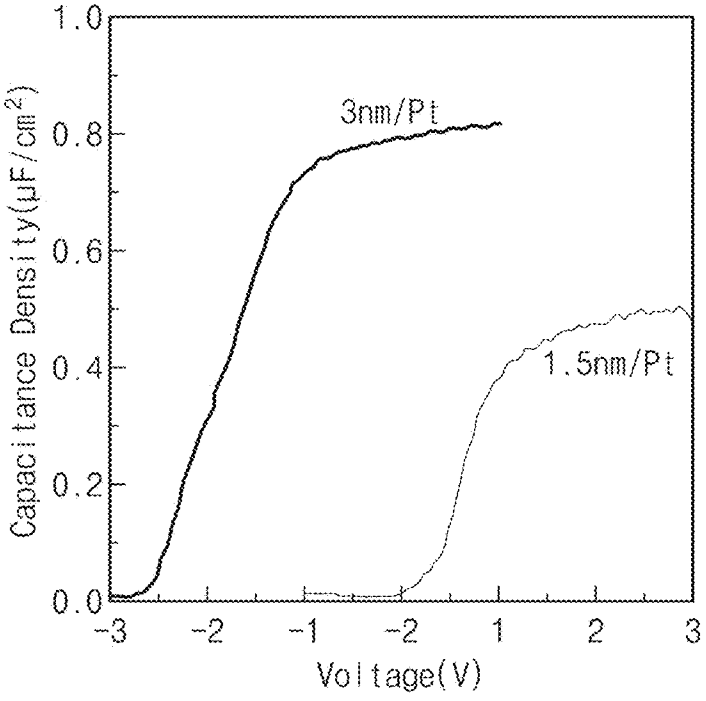

FIGS. 7A and 7B are graphs for explaining electrical characteristics of an electronic device according to Preparation Example 1, an electronic device according to Preparation Example 3, and an electronic device according to Preparation Example 4.

An electronic device according to Preparation Example 3 and an electronic device according to Preparation Example 4 were manufactured. The electronic device according to Preparation Example 3 and the electronic device according to Preparation Example 4 were manufactured such that the gate insulating film contains $HfO_2$ and has a thickness of 6 nm, the lower material film contains ZnO and has a thickness of 3 nm, the gate electrode contains Pt, the source electrode and the drain electrode contain Ti, the substrate contains $SiO_2$, and the upper material film contains $Al_2O_3$.

The electronic device according to Preparation Example 3 was manufactured so that the thickness of the $Al_2O_3$ upper material film was 3 nm. The electronic device according to Preparation Example 4 was manufactured so that the thickness of the $Al_2O_3$ upper material film was 1.5 nm.

Referring to FIG. 7A, the capacitance density according to the voltage applied to the gate electrode in the electronic device according to Preparation Example 1 and the electronic device according to Preparation Example 3 was measured. In preparation for Preparation Example 1 (Cr), it was confirmed that the flat band voltage $V_{FB}$ was shifted by about (+)1 V in Preparation Example 3 (Pt). It was confirmed that the threshold voltage of the electronic device according to Preparation Example 3 was lower than 0 V, and it was confirmed that the electronic device according to Preparation Example 3 was a normally-on transistor.

Referring to FIG. 7B, the capacitance density according to the voltage applied to the gate electrode in the electronic device according to Preparation Example 3 and the electronic device according to Preparation Example 4 was measured. In preparation for Preparation Example 3 (3 nm), it was confirmed that the flat band voltage $V_{FB}$ was shifted by approximately (+) 3 V in Preparation Example 4 (1.5 nm). It was confirmed that the threshold voltage of the electronic device according to Preparation Example 4 was higher than 0 V, and it was confirmed that the electronic device according to Preparation Example 4 was a normally-off transistor.

Figure 8:
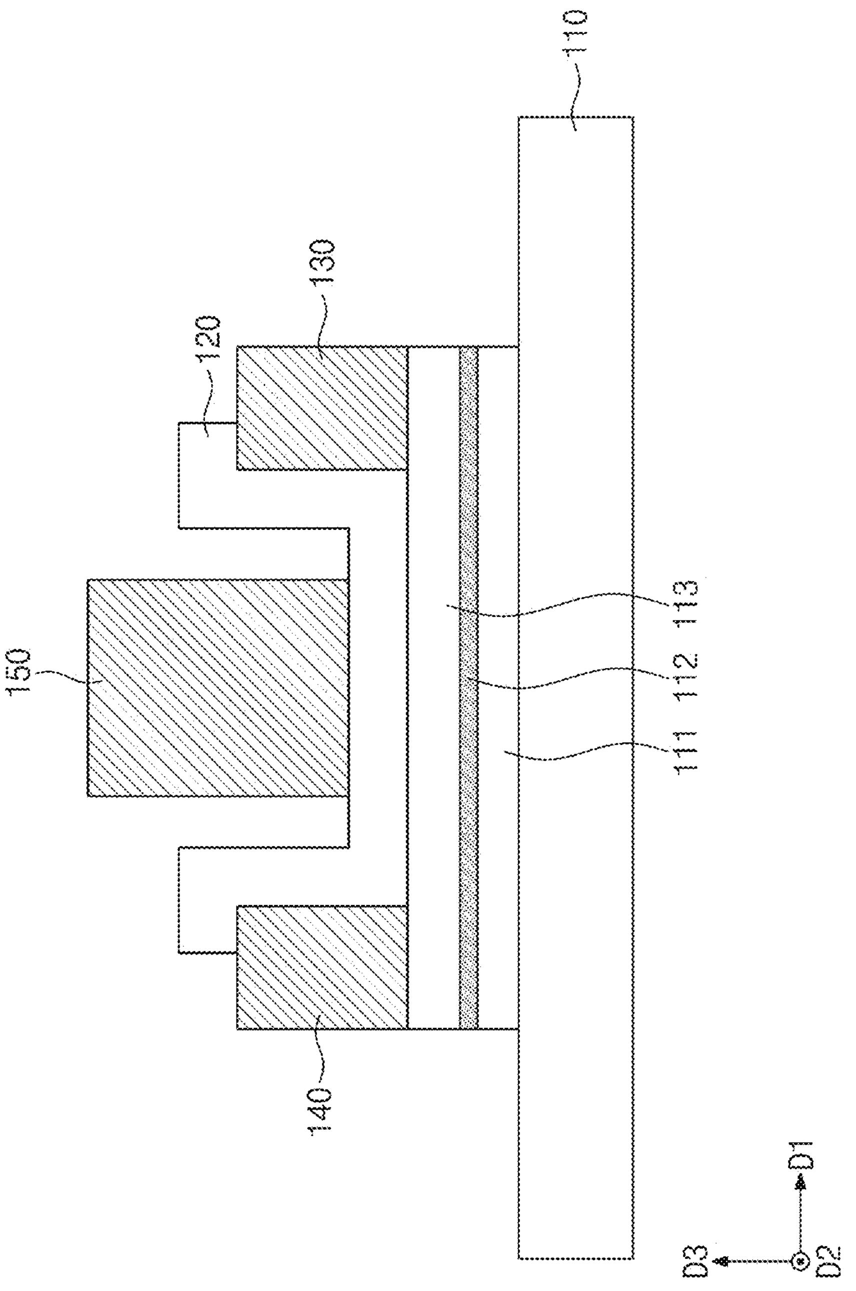
FIG. 8 is a cross-sectional view of an electronic device according to a second embodiment.

FIG. 8 is a cross-sectional view of an electronic device according to a second embodiment.

Referring to FIG. 8, the electronic device may include a substrate 110, a lower material film 111 on the substrate 110, an upper material film 113 on the lower material film 111, a two-dimensional electron gas 112 between the lower material film 111 and the upper material film 113, a source electrode 130 on the upper material film 113, a drain electrode 140 on the upper material film 113, a gate insulating film 120 on the upper material film 113, and a gate electrode 150 on the gate insulating film 120.

The sidewall of the source electrode 130 may be coplanar with the sidewalls of the lower material film 111 and the upper material film 113. The sidewall of the drain electrode 140 may be coplanar with the sidewalls of the lower material film 111 and the upper material film 113.

Figure 9:
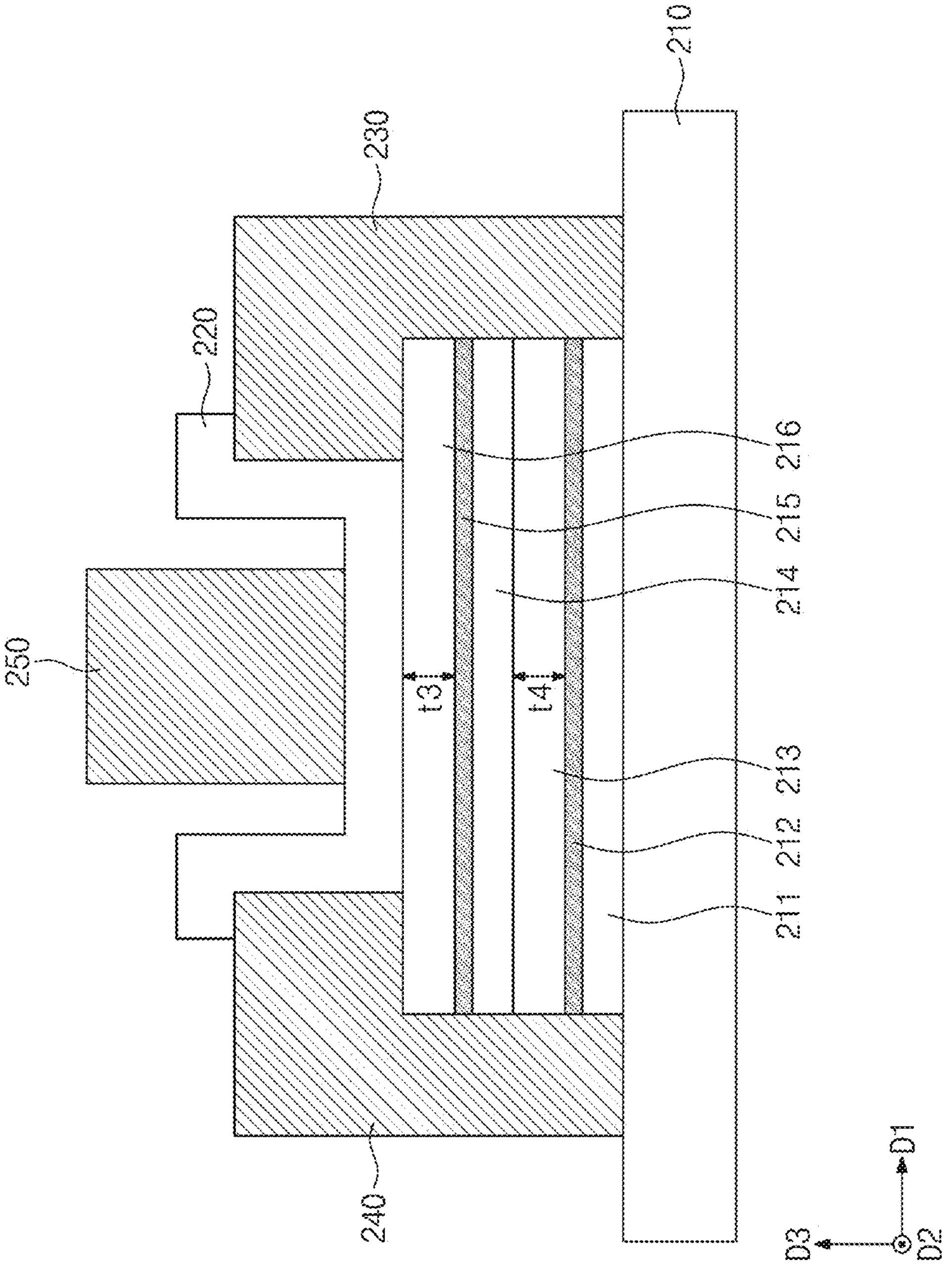
FIG. 9 is a cross-sectional view of an electronic device according to a third embodiment.

FIG. 9 is a cross-sectional view of an electronic device according to a third embodiment.

Referring to FIG. 9, the electronic device may include a substrate 210, a first lower material film 211 on the substrate 210, a first upper material film 213 on the first lower material film 211, a first two-dimensional electron gas 212 between the first lower material film 211 and the first upper material film 213, a second lower material film 214 on the first upper material film 213, a second upper material film 216 on a second lower material film 214, a second two-dimensional electron gas 215 between the second lower material film 214 and the second upper material film 216, a source electrode 230 on the second upper material film 216, a drain electrode 240 on the second upper material film 213, a gate insulating film 220 on the second upper material film 213, and a gate electrode 250 on the gate insulating film 220.

The source electrode 230 may be in ohmic contact with the first two-dimensional electron gas 212 and the second two-dimensional electron gas 215. The drain electrode 240 may be in ohmic contact with the first two-dimensional electron gas 212 and the second two-dimensional electron gas 215.

The electronic device may be a multi-valued logic device having a first two-dimensional electron gas 212 and a second two-dimensional electron gas 215 as channels. The first two-dimensional electron gas 212 and the second two-dimensional electron gas 215 may be normally-on channels. Since the distance between the first two-dimensional electron gas 212 and the gate electrode 250 is greater than the distance between the second two-dimensional electron gas 215 and the gate electrode 250, the first threshold voltage of the first two-dimensional electron gas 212 and the second threshold voltage of the second two-dimensional electron gas 215 may be different from each other.

The thickness t3 of the second upper material film 216 may be 1.5 nm or more. When the thickness t3 of the second upper material film 216 is less than 1.5 nm, the sheet resistance may increase so that the second two-dimensional electron gas 215 may not be formed.

The thickness of the second lower material film 214 may be 2.5 nm to 6 nm. When the thickness of the second lower material film 214 is less than 2.5 nm, the second two-dimensional electron gas 215 may not be formed between the second lower material film 214 and the second upper material film 216. When the thickness of the second lower material film 214 is 6 nm or more, the conductivity of the second lower material film 214 may be relatively large, and the electronic device may not operate as a transistor.

The thickness t4 of the first upper material film 213 may be 2.5 nm or less. When the thickness t4 of the first upper material film 213 is greater than 2.5 nm, the first threshold voltage may become excessively large, and the switching speed of the first two-dimensional electron gas 212 may become excessively small. Accordingly, transistor characteristics of the electronic device may be deteriorated. The thickness t4 of the first upper material film 213 may be 0.5 times or more of the thickness t3 of the second upper material film 216. When the thickness t4 of the first upper material film 213 is less than 0.5 times the thickness t3 of the second upper material film 216, since the first threshold voltage and the second threshold voltage are not separated, the electronic device may not operate as a multi-valued logic device.

The thickness of the first lower material film 211 may be 2.5 nm to 6 nm. When the thickness of the first lower material film 211 is less than 2.5 nm, the first two-dimensional electron gas 212 may not be formed between the first lower material film 211 and the first upper material film 213. When the thickness of the first lower material film 211 is 6 nm or more, the conductivity of the first lower material film 211 may be relatively large, and the electronic device may not operate as a transistor.

In the electronic device, when the magnitude of the gate-source potential difference becomes greater than the magnitude of the second threshold voltage, the second two-dimensional electron gas 215 channel may be turned off, and when the magnitude of the gate-source potential difference becomes greater than the magnitude of the first threshold voltage, the first two-dimensional electron gas 212 channel may be turned off. The magnitude of the first threshold voltage may be greater than the magnitude of the second threshold voltage.

An operating method of an electronic device includes applying a voltage to the gate electrode 250 and the source electrode 230 so that the magnitude of the gate-source potential difference becomes greater than the magnitude of the second threshold voltage and applying a voltage to the gate electrode 250 and the source electrode 230 so that the magnitude of the gate-source potential difference becomes greater than the magnitude of the first threshold voltage.

In the electronic device, the second two-dimensional electron gas 215 channel and the first two-dimensional electron gas 212 channel may be sequentially turned off due to a difference between the first threshold voltage and the second threshold voltage.

The electronic device may operate in a “logic 2” state, a “logic 1” state and a “logic 0” state. A state in which the first two-dimensional electron gas 212 channel and the second two-dimensional electron gas 215 channel are both on may be defined as a “logic 2” state, a state in which the first two-dimensional electron gas 212 channel is on and the second two-dimensional electron gas 215 channel is off may be defined as a “logic 1” state, and a state in which the first two-dimensional electron gas 212 channel and the second two-dimensional electron gas 215 channel are both off may be defined as a “logic 0” state.

Figure 10A:
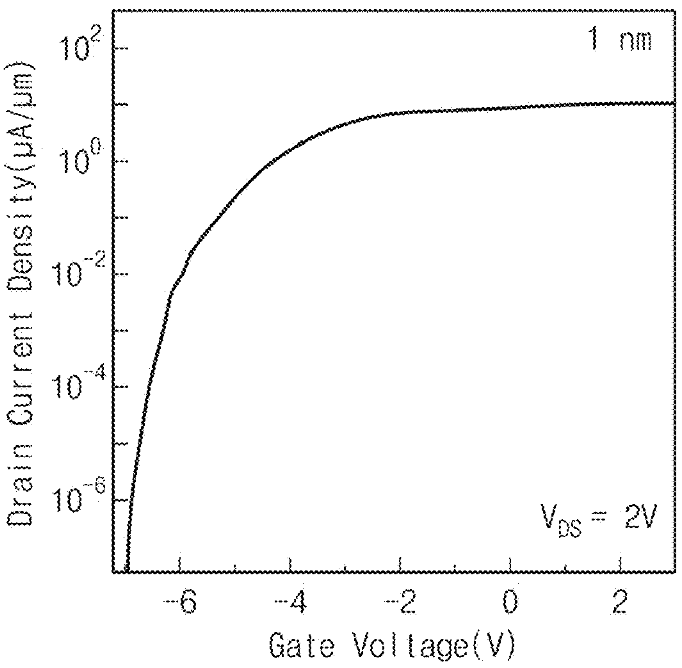
FIGS. 10A, 10B, and 10C are graphs for explaining electrical characteristics of an electronic device according to Comparative Example 1.
Figure 10B:
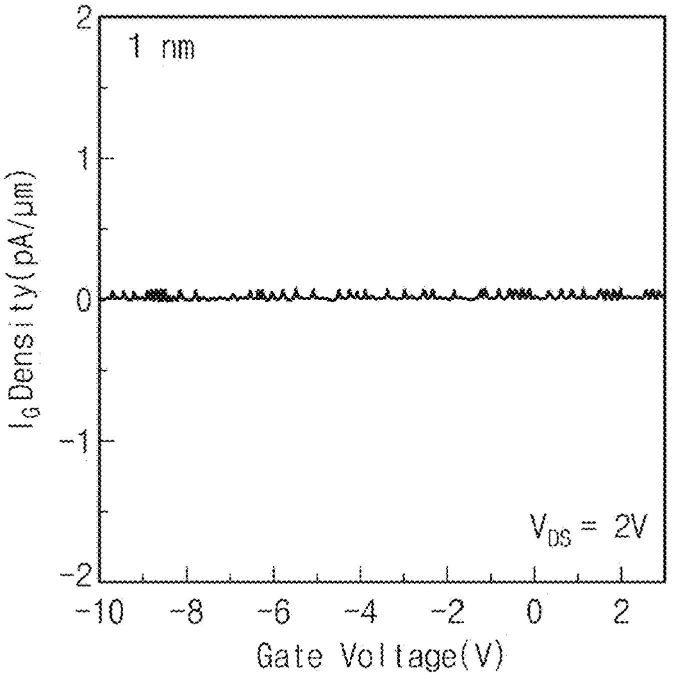
Figure 10C:
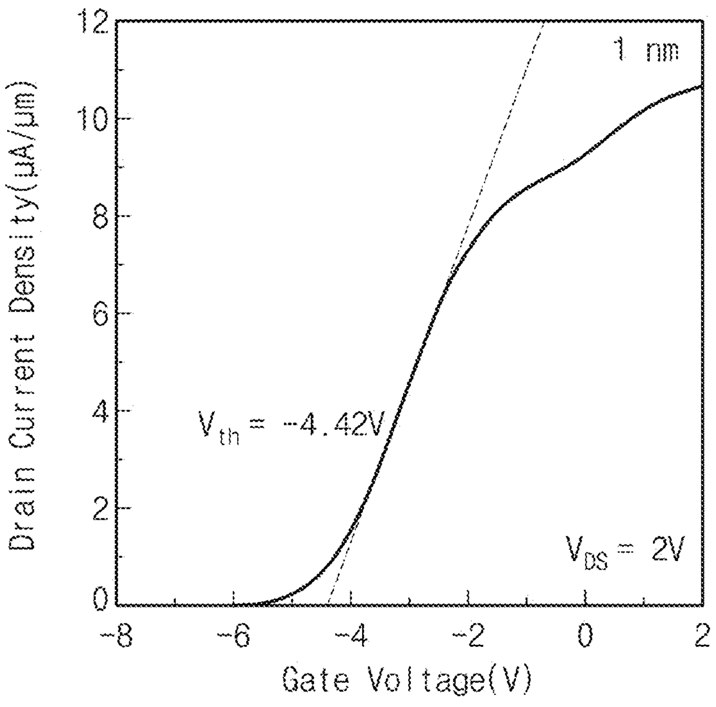

FIGS. 10A, 10B, and 10C are graphs for explaining electrical characteristics of an electronic device according to Comparative Example 1.

An electronic device according to Comparative Example 1 was manufactured. The electronic device according to Comparative Example 1 was manufactured so that the gate insulating film contains $HfO_2$ and has a thickness of 6 nm, the first lower material film contains ZnO and has a thickness of 3 nm, the second lower material film contains ZnO and has a thickness of 3 nm, the gate electrode contains Cr, the source electrode and the drain electrode contain Ti, the substrate contains $SiO_2$, the first upper material film contains $Al_2O_3$, and the second upper material film contains $Al_2O_3$. The electronic device according to Comparative Example 1 was manufactured such that the first upper material film had a thickness of 1 nm and the second upper material film had a thickness of 3 nm.

10A to 10C, when the magnitude of the drain-source potential difference Vim is 2 V, it was confirmed that the threshold voltage $V_{th}$ is −4.42 V, and it was confirmed that the threshold voltage $V_{th}$ is not divided into the first threshold voltage and the second threshold voltage. As the thickness of the first upper material film is less than 0.5 times the thickness of the second upper material film, the threshold voltage $V_{th}$ is not divided into the first threshold voltage and the second threshold voltage such that it was confirmed that the electronic device according to Comparative Example 1 cannot operate as a multi-valued logic device.

Figure 11A:
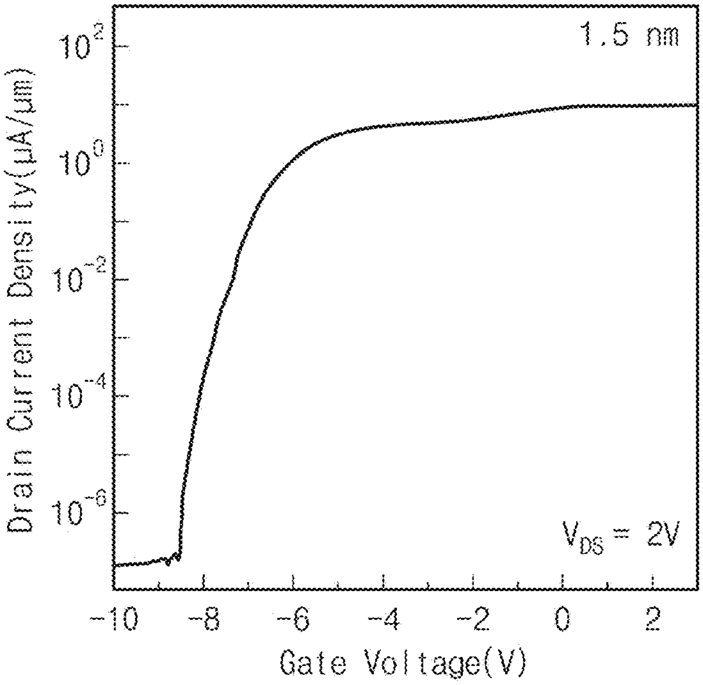
FIGS. 11A, 11B, and 11C are graphs for explaining electrical characteristics of an electronic device according to Preparation Example 5.
Figure 11B:
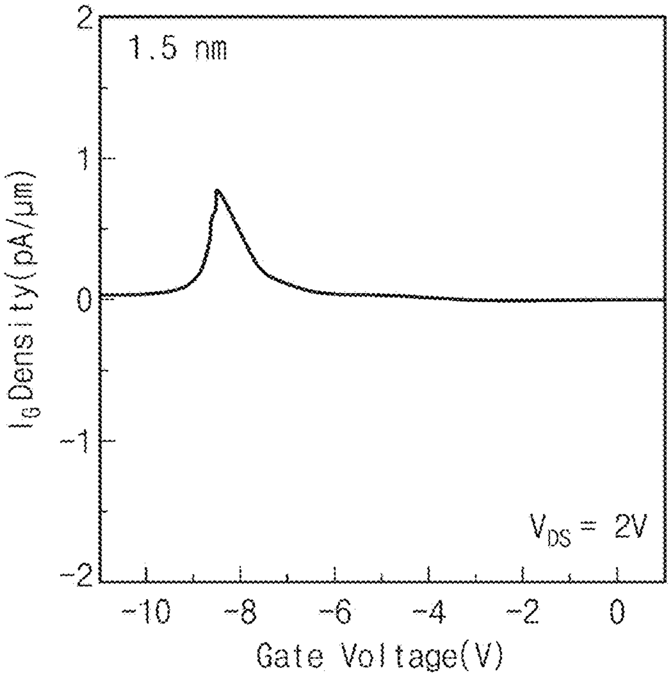
Figure 11C:
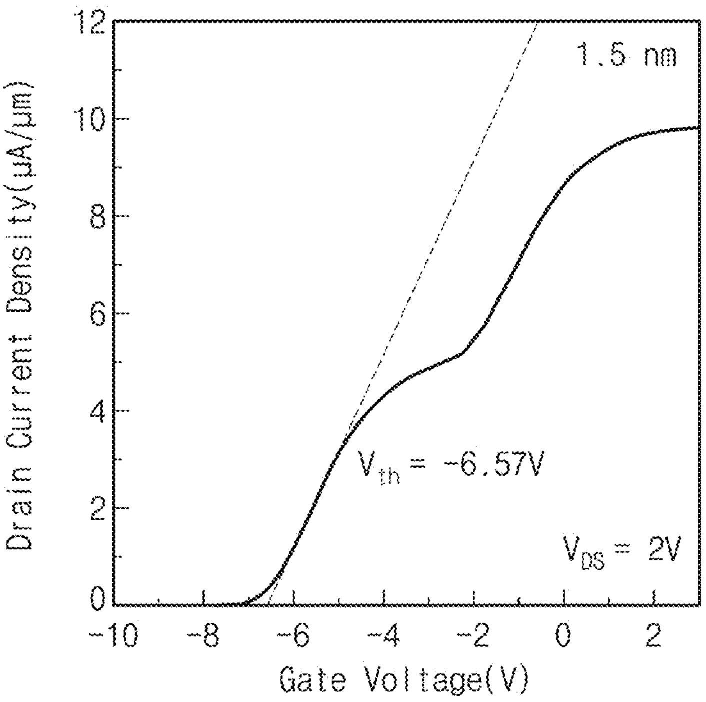

FIGS. 11A, 11B, and 11C are graphs for explaining electrical characteristics of an electronic device according to Preparation Example 5.

According to the electronic device of FIG. 9, an electronic device according to Preparation Example 5 was manufactured. The electronic device according to Preparation Example 5 was manufactured so that the gate insulating film contains $HfO_2$ and has a thickness of 6 nm, the first lower material film contains ZnO and has a thickness of 3 nm, the second lower material film contains ZnO and has a thickness of 3 nm, the gate electrode contains Cr, the source electrode and the drain electrode contain Ti, the substrate contains $SiO_2$, the first upper material film contains $Al_2O_3$, and the second upper material film contains $Al_2O_3$. The electronic device according to Preparation Example 5 was manufactured such that the first upper material film had a thickness of 1.5 nm and the second upper material film had a thickness of 3 nm.

Referring to FIGS. 11A to 11C, it was confirmed that the first threshold voltage $V_{th}$ and the second threshold voltage are distinguished when the drain-source potential difference $V_{DS}$ is 2 V, and it was confirmed that the first threshold voltage $V_{th}$ was −6.57 V so that it was confirmed that the transistor characteristics did not deteriorate. Accordingly, it was confirmed that the electronic device according to Preparation Example 5 may operate as a multi-valued logic device.

Figure 12A:
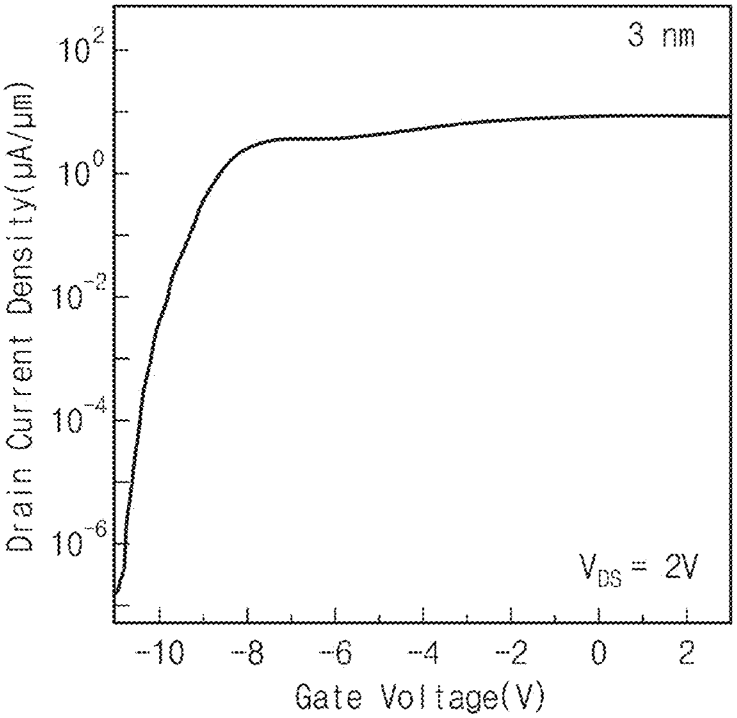
FIGS. 12A, 12B, and 12C are graphs for explaining electrical characteristics of an electronic device according to Comparative Example 2.
Figure 12B:
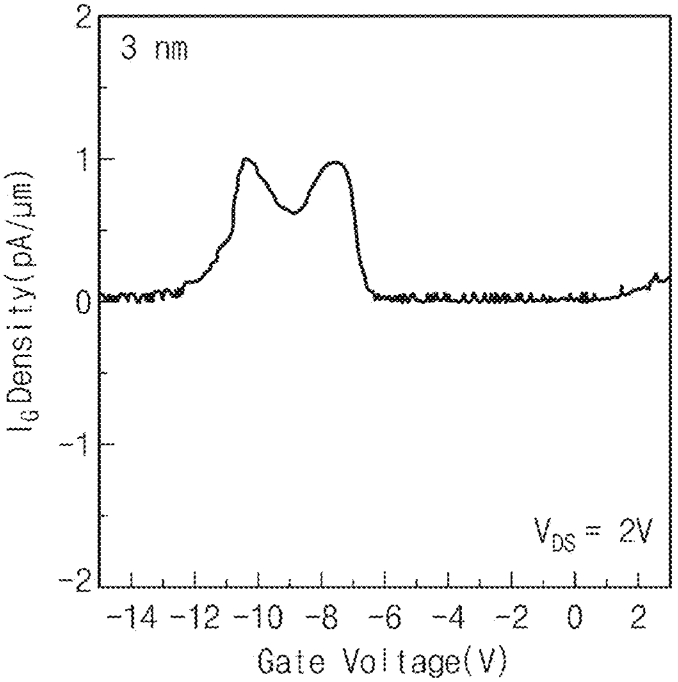
Figure 12C:
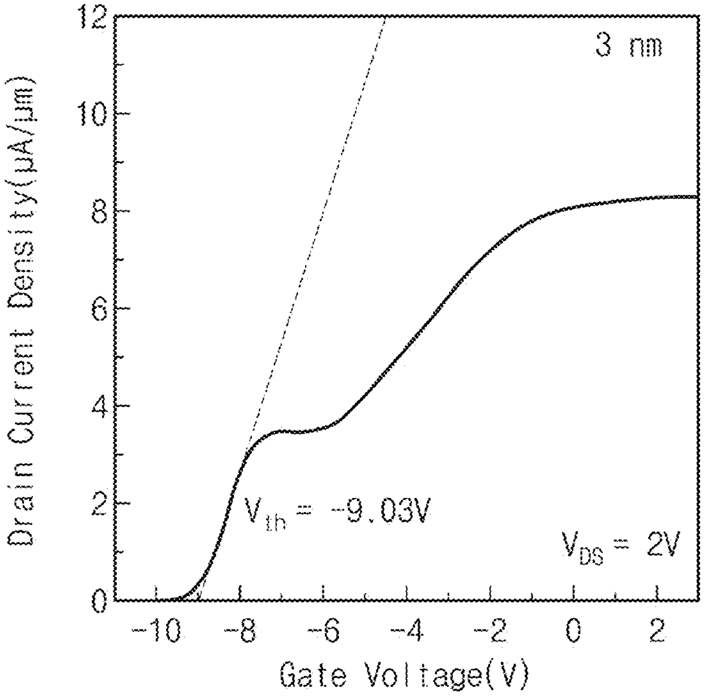

FIGS. 12A, 12B, and 12C are graphs for explaining electrical characteristics of an electronic device according to Comparative Example 2.

An electronic device according to Comparative Example 2 was manufactured. The electronic device according to Comparative Example 2 was manufactured so that the gate insulating film contains $HfO_2$ and has a thickness of 6 nm, the first lower material film contains ZnO and has a thickness of 3 nm, the second lower material film contains ZnO and has a thickness of 3 nm, the gate electrode contains Cr, the source electrode and the drain electrode contain Ti, the substrate contains $SiO_2$, the first upper material film contains $Al_2O_3$, and the second upper material film contains $Al_2O_3$. The electronic device according to Comparative Example 2 was manufactured such that the first upper material film had a thickness of 3 nm and the second upper material film had a thickness of 3 nm.

Referring to FIGS. 12A to 12C, when the magnitude of the drain-source potential difference Vim was 2 V, it was confirmed that the first threshold voltage $V_{th}$ and the second threshold voltage were distinguished, and it was confirmed that the first threshold voltage $V_{th}$ was −9.03 V, so that it was confirmed that the first threshold voltage $V_{th}$ was excessively large.

Referring to FIGS. 10A to 12C, it was confirmed that it may operate as a multi-valued logic device if the thickness of the first upper material film is 0.5 times or more of the thickness of the second upper material film, and it was confirmed that the transistor characteristics did not deteriorate when the thickness of the first upper material film was 2.5 nm or less.

Electrical characteristics of the electronic device according to Comparative Example 1, the electronic device according to Preparation Example 5, and the electronic device according to Comparative Example 2 were measured as shown in [Table 2] below. In Table 2 below, $I_{on}$, $I_{off}$, $I_{on}/I_{off}$, and SS were measured under the condition that the gate-source potential difference $V_{GS}$ was 2 V and the drain-source potential difference $V_{DS}$ was 2 V.

TABLE 2

| | Comparative Example 1 | Comparative Example 5 | Comparative Example 2 |
|---|---|---|---|
| $I_{on}$ (μA/μm) | 10.87 | 9.692 | 8.272 |
| $I_{off}$ (μA/μm) | $1.40 \times 10^{-7}$ | $1.04 \times 10^{-7}$ | $4.09 \times 10^{-8}$ |
| $I_{on}/I_{off}$ | $\sim 7.8 \times 10^{7}$ | $\sim 9.3 \times 10^{7}$ | $\sim 2.2 \times 10^{8}$ |
| $V_{th}$ (V) | −4.42 | −6.57 | −9.03 |
| SS (mV/dec.) | 147.3 | 163.5 | 180.0 |

As described above, it was confirmed that as the thickness of the first upper material film increased, the voltage drop by the first upper material film increased. It was confirmed that the threshold voltage may be divided into the first threshold voltage and the second threshold voltage according to the thickness control of the first upper material film, and the electronic device may operate as a multi-valued logic device. It was confirmed that as the thickness of the first upper material film increased, the switching speed decreased (SS increased).

Figure 13A:
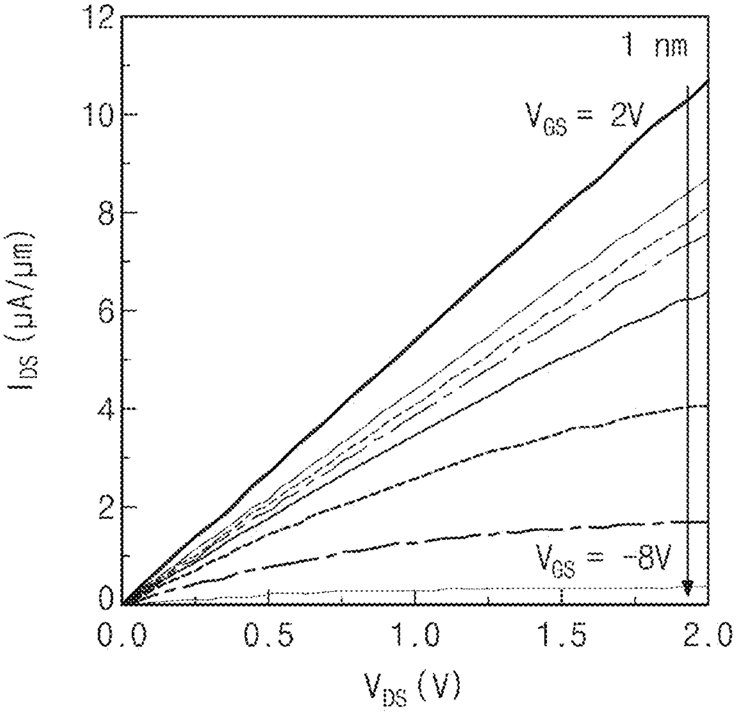
FIGS. 13A, 13B, and 13C are graphs for explaining ohmic contacts of an electronic device according to Comparative Example 1, an electronic device according to Preparation Example 5, and an electronic device according to Comparative Example 2.
Figure 13B:
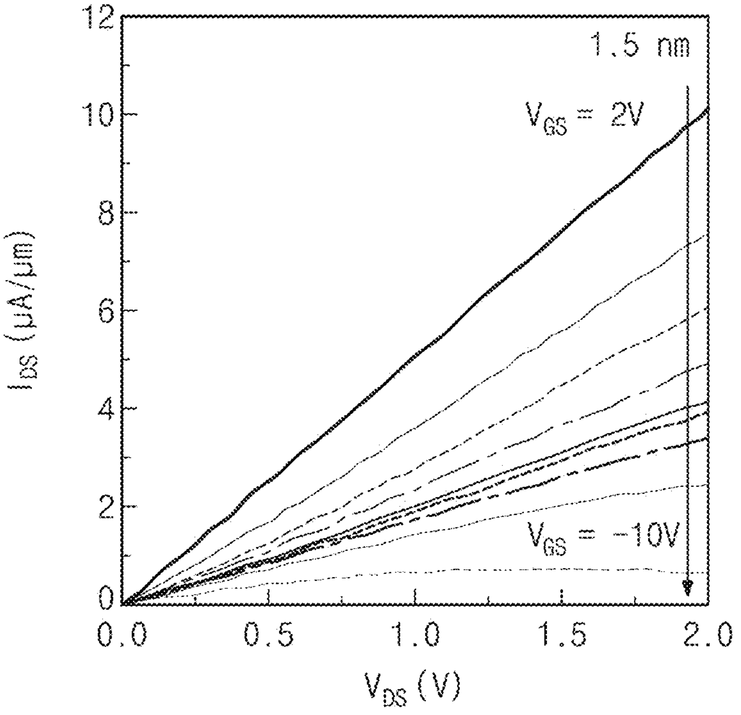
Figure 13C:
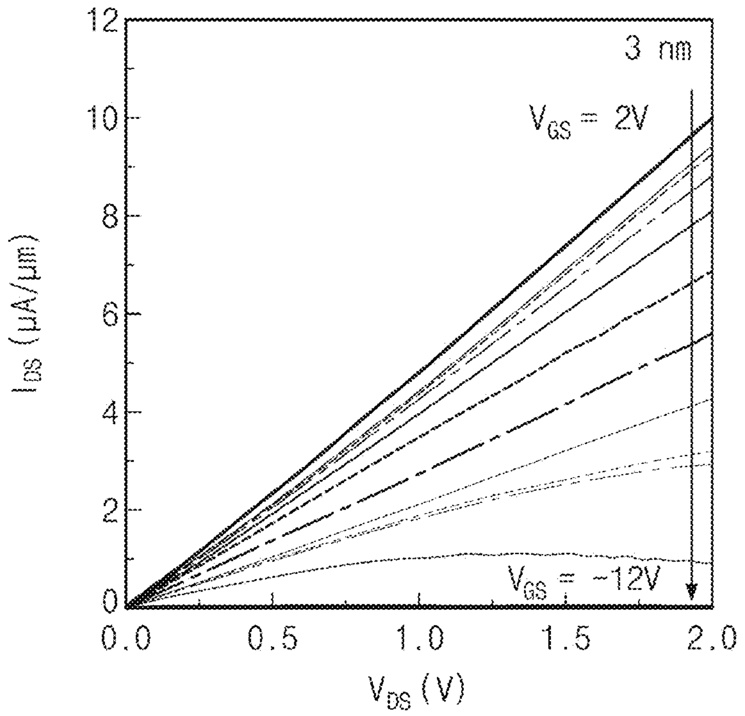

FIGS. 13A, 13B, and 13C are graphs for explaining ohmic contacts of an electronic device according to Comparative Example 1, an electronic device according to Preparation Example 5, and an electronic device according to Comparative Example 2.

Referring to FIG. 13A, the drain-source current $I_{DS}$ according to the drain-source potential difference $V_{DS}$ of the electronic device according to Comparative Example 1 was measured. The drain-source current $I_{DS}$ was measured while decreasing the gate-source potential difference $V_{GS}$ from 2 V to −8 V. With the gate-source potential difference $V_{GS}$ condition in which the channels of the first and second two-dimensional electron gases are on, it was confirmed that the drain-source current $I_{DS}$ linearly increased as the magnitude of the drain-source potential difference $V_{DS}$ increased, so that this proves that the source electrode and the drain electrode and the first and second two-dimensional electron gases form an ohmic contact.

Referring to FIG. 13B, the drain-source current $I_{DS}$ according to the drain-source potential difference $V_{DS}$ of the electronic device according to Preparation Example 5 was measured. The drain-source current $I_{DS}$ was measured while decreasing the gate-source potential difference $V_{GS}$ from 2 V to −10 V. With the gate-source potential difference $V_{GS}$ condition in which the first and second two-dimensional electron gas channels are on, it was confirmed that the drain-source current $I_{DS}$ linearly increased as the magnitude of the drain-source potential difference $V_{DS}$ increased, so that this proves that the source electrode and the drain electrode and the first and second two-dimensional electron gases form an ohmic contact.

Referring to FIG. 13C, the drain-source current $I_{DS}$ according to the drain-source potential difference $V_{DS}$ of the electronic device according to Comparative Example 2 was measured. The drain-source current $I_{DS}$ was measured while decreasing the gate-source potential difference $V_{GS}$ from 2 V to −12 V. With the gate-source potential difference $V_{GS}$ condition in which the first and second two-dimensional electron gas channels are on, it was confirmed that the drain-source current $I_{DS}$ linearly increased as the drain-source potential difference $V_{DS}$ increased, so that this proves that the source electrode and the drain electrode and the first and second two-dimensional electron gases form an ohmic contact.

Figure 14:
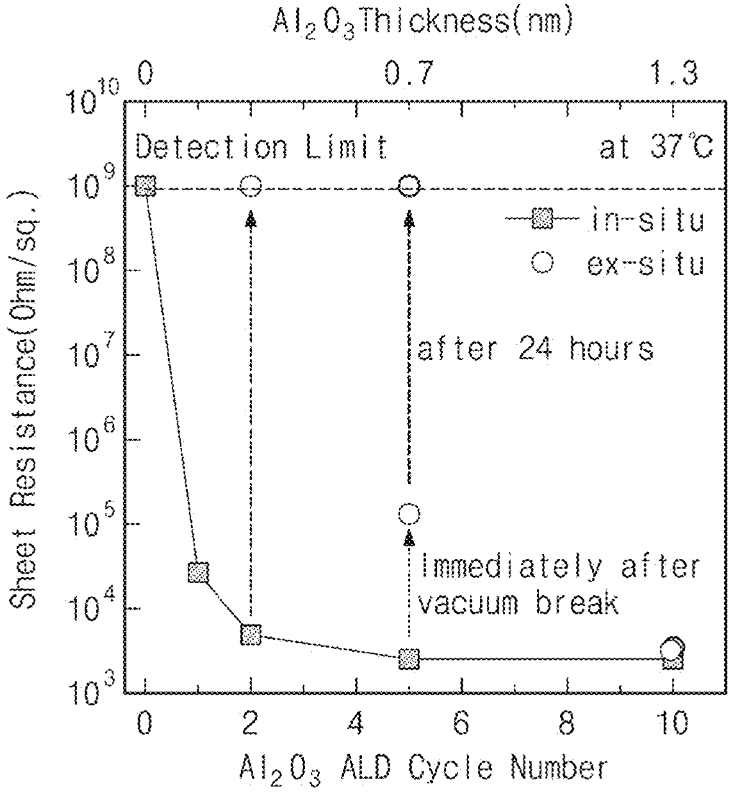
FIG. 14 is a graph for explaining the thickness of an upper material film for forming a two-dimensional electron gas.

FIG. 14 is a graph for explaining the thickness of an upper material film for forming a two-dimensional electron gas.

Referring to FIG. 14, a plurality of heterojunction structures were manufactured. The heterojunction structures were manufactured so that each of the heterojunction structures included a substrate, a ZnO lower material film on the substrate, and an $Al_2O_3$ upper material film on the ZnO lower material film. The heterojunction structures were fabricated so that the thicknesses of the $Al_2O_3$ upper material films of the heterojunction structures were different.

As the $Al_2O_3$ atomic layer deposition (ALD) cycle increased, the thickness of the $Al_2O_3$ upper material film became thicker. When the vacuum state is maintained (in-situ) after the $Al_2O_3$ upper material film is formed, it was confirmed that the sheet resistance of the heterojunction structure did not increase regardless of the thickness of the $Al_2O_3$ upper material film. When the vacuum state is not maintained after the $Al_2O_3$ upper material film is formed (ex-situ), it was confirmed that the sheet resistance was increased as the $Al_2O_3$ upper material film was exposed to air and it was confirmed that the increase in sheet resistance was smaller as the thickness of the $Al_2O_3$ upper material film increased. Therefore, if the vacuum is not maintained, it was confirmed that the thickness of the $Al_2O_3$ upper material film was sufficiently increased to prevent an increase in sheet resistance and maintain the two-dimensional electron gas characteristics.

In the case of the upper material film 13 of the electronic device according to the first embodiment, the upper material film 113 of the electronic device according to the second embodiment, and the second upper material film 216 of the electronic device according to the third embodiment, after the upper material film 13, the upper material film 113 and the second upper material film 216 are formed, a vacuum state cannot be maintained to form other configurations. Therefore, in order to prevent an increase in sheet resistance and maintain a two-dimensional electron gas, the upper material film 13, the upper material film 113 and the second upper material film 216 may have to have a thickness of 1.5 nm or more. In the case of the first upper material film 213 of the electronic device according to the third embodiment, since the second lower material film 214 may be formed on the first upper material film 213 in a vacuum state, the first upper material film 213 may not be exposed to the air.

Figure 15:
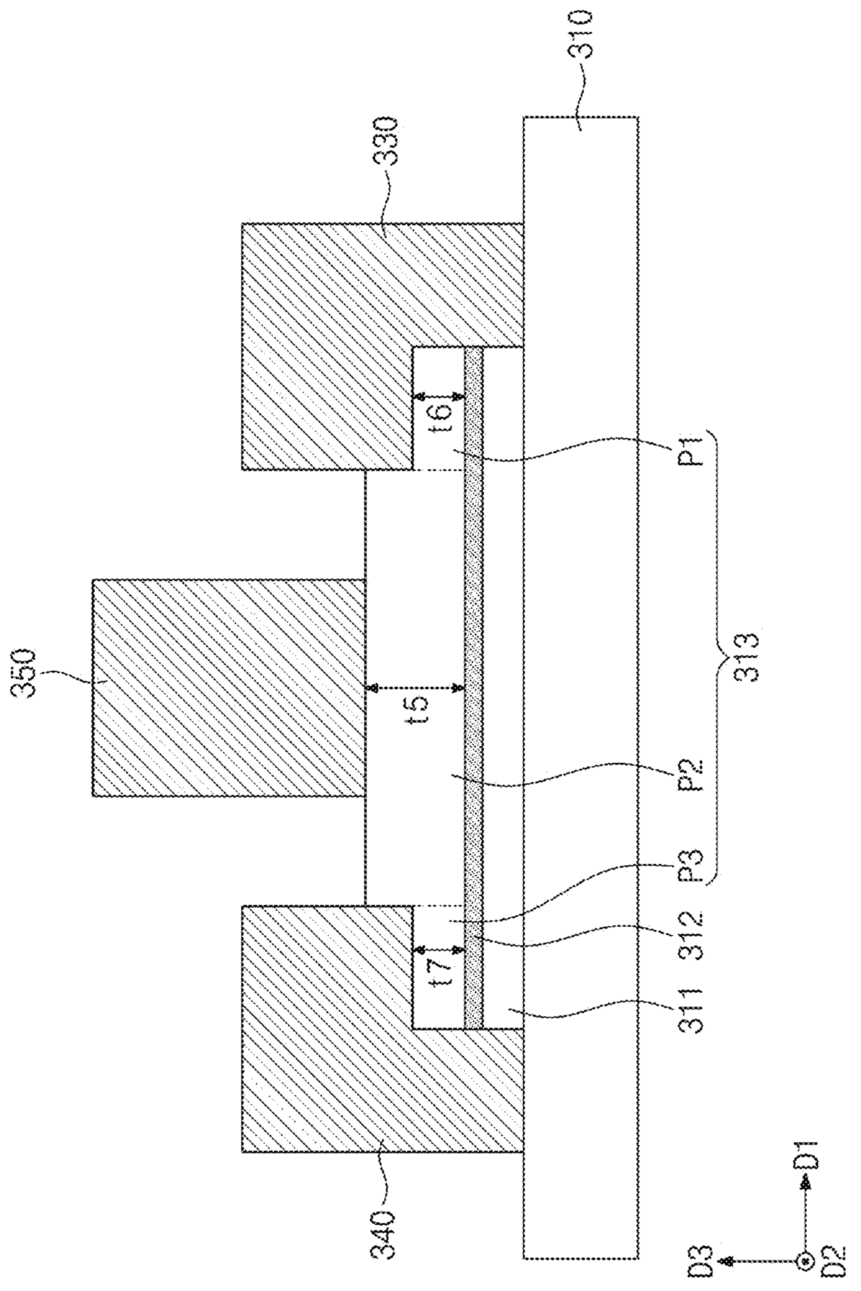
FIG. 15 is a cross-sectional view of an electronic device according to a fourth embodiment.

FIG. 15 is a cross-sectional view of an electronic device according to a fourth embodiment.

Referring to FIG. 15, the electronic device may include a substrate 310, a lower material film 311, a two-dimensional electron gas 312, an upper material film 313, a source electrode 330 on the upper material film 313, a drain electrode 340 on the upper material film 313, and a gate electrode 350 on the upper material film 313.

The upper material film 313 may be, for example, an aluminum oxide film, a hafnium oxide film, or a zinc sulfide film. The lower material film 311 may be, for example, a zinc oxide film. The gate electrode 350 may include, for example, chromium. The source electrode 330 and the drain electrode 340 may include, for example, titanium.

The upper material film 313 may include a first portion P1 in contact with the source electrode 330, a second portion P2 in contact with the gate electrode 350, and a third portion P3 in contact with the drain electrode 340. The first to third portions P1, P2, and P3 of the upper material film 313 may be planarly separated portions. The second portion P2 of the upper material film 313 may be disposed between the first and third portions P1 and P3 of the upper material film 313.

The thickness t5 of the second portion P2 of the upper material film 313 may be greater than the thickness t6 of the first portion P1 and the thickness t7 of the third portion P3 of the upper material film 313. For example, the thickness of the second portion P2 of the upper material film 313 may be 5 nm or more.

The level of the upper surface of the first portion P1 of the upper material film 313 and the level of the upper surface of the third portion P3 of the upper material film 313 may be lower than the level of the upper surface of the second portion P2 of the upper material film 313.

As the thickness t5 of the second portion P2 of the upper material film 313 is relatively thickened, the second portion P2 of the upper material film 313 may serve as a gate insulating film of the gate electrode 350 and may block a gate leakage current. As the thickness t6 of the first portion P1 and the thickness t7 of the third portion P3 of the upper material film 313 are made relatively thin, it is possible to reduce the voltage drop according to the thickness of the upper material film 313, so that the threshold voltage of the electronic device may be relatively low.

Figure 16:
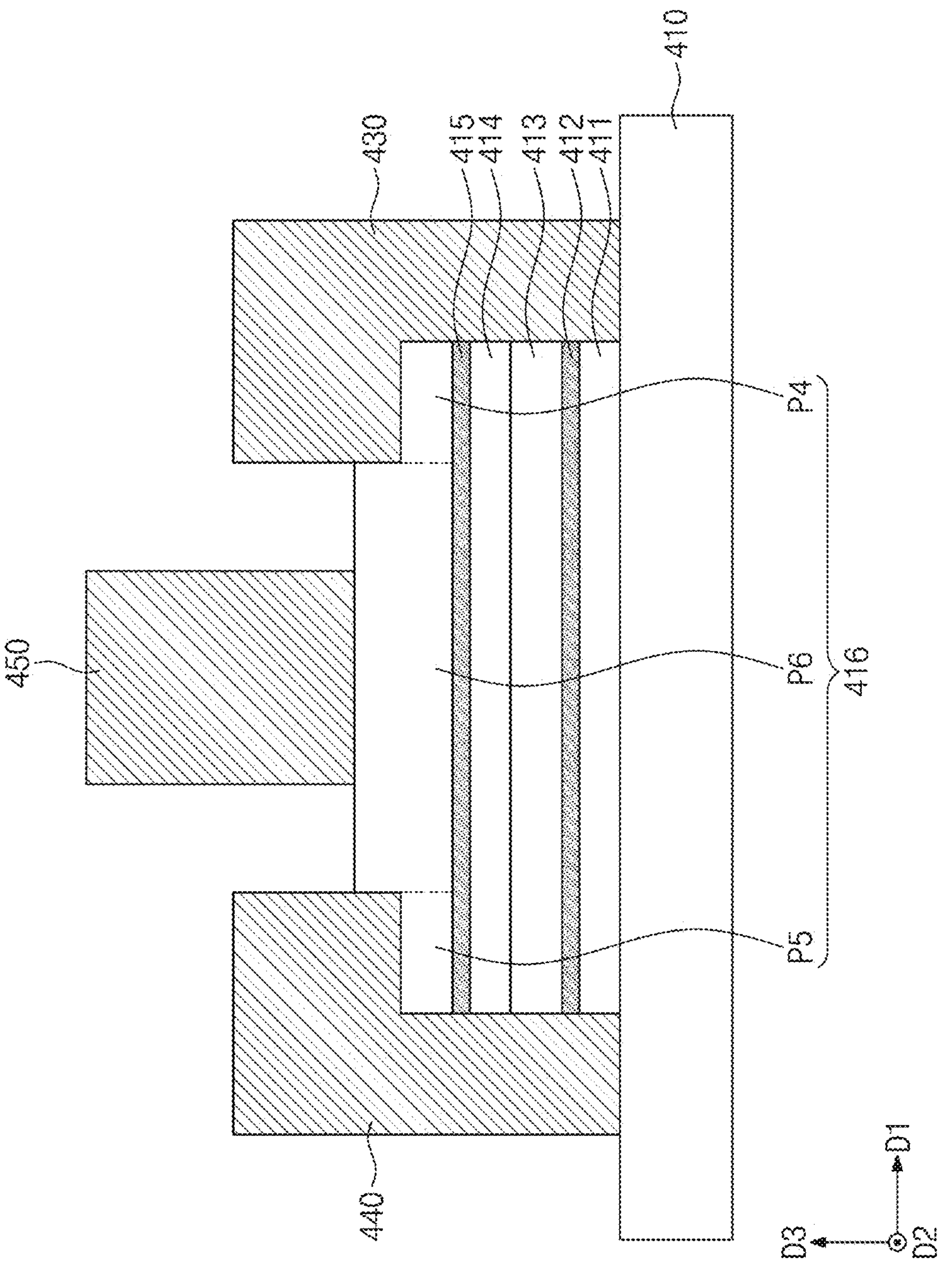
FIG. 16 is a cross-sectional view of an electronic device according to a fifth embodiment.

FIG. 16 is a cross-sectional view of an electronic device according to a fifth embodiment.

Referring to FIG. 16, an electronic device may include a substrate 410, a first lower material film 411, a first two-dimensional electron gas 412, a first upper material film 413, a second lower material film 414, a second two-dimensional electron gas 415, a second upper material film 416, a source electrode 430, a drain electrode 440, and a gate electrode 450.

The second upper material film 416 may include a first portion P4 in contact with the source electrode 430, a second portion P5 in contact with the drain electrode 440, and a third portion P6 in contact with the gate electrode 450. The thickness of the third portion P6 of the second upper material film 416 may be greater than the thickness of the first and second portions P4 and P5 of the second upper material film 416.

Embodiments of the inventive concept may provide an electronic device capable of operating as a ternary multi-valued logic device in which three multi-resistance states are induced by controlling the threshold voltage of the two-dimensional electron gas channel through material film thickness control.

Embodiments of the inventive concept may provide an electronic device including a two-dimensional electron gas channel with a relatively low threshold voltage.

Although the embodiments of the inventive concept have been described, it is understood that the inventive concept should not be limited to these embodiments but various changes and modifications may be made by one ordinary skilled in the art within the spirit and scope of the inventive concept as hereinafter claimed.

What is claimed is:

1. An electronic device comprising:

a first lower material film;

a first upper material film on the first lower material film;

a first two-dimensional electron gas between the first lower material film and the first upper material film;

a second lower material film on the first upper material film;

a second upper material film on the second lower material film;

a second two-dimensional electron gas between the second lower material film and the second upper material film;

a source electrode on the second upper material film;

a drain electrode on the second upper material film;

a gate insulating film on the second upper material film; and a gate electrode on the gate insulating film, wherein a thickness of the first upper material film is at least 0.5 times a thickness of the second upper material film, wherein the thickness of the first upper material film is 1.5 nm or more and less than 2.5 nm, wherein the thickness of the first upper material film is less than the thickness of the second upper material film, wherein the first upper material film and the second upper material film consist of aluminum oxide, wherein thicknesses of the first lower material film and the second lower material film are 2.5 nm or more and less than 6 nm, wherein the first lower material film and the second lower material film consist of zinc oxide, wherein the source electrode is in contact with a first side surface of the first lower material film, a first side surface of the first upper material film, a first side surface of the second lower material film, a first side surface of the second upper material film, and an upper surface of the second upper material film, wherein the drain electrode is in contact with a second side surface of the first lower material film, a second side surface of the first upper material film, a second side surface of the second lower material film, a second side surface of the second upper material film, and the upper surface of the second upper material film, wherein a first thickness group including the thickness of the second upper material film and the thickness of the first upper material film sets a first threshold voltage, wherein a second thickness group including a thickness of the gate insulating film and the thickness of the second upper material film sets a second threshold voltage, wherein the second threshold voltage is greater than the first threshold voltage, and wherein the electronic device is configured to operate in a "logic 2" state in which the first two-dimensional electron gas and the second two-dimensional electron gas are both on in response to the gate electrode receiving a voltage greater than the second threshold voltage, a "logic 1" state in which the first two-dimensional electron gas is on and the second two-dimensional electron gas is off in response to the gate electrode receiving a voltage between the first threshold voltage and the second threshold voltage, and a "logic 0" state in which the first two-dimensional electron gas and the second two-dimensional electron gas are both off in response to the gate electrode receiving a voltage less than the first threshold voltage.

2. The electronic device of claim 1, wherein the gate insulating film comprises hafnium oxide.

3. The electronic device of claim 1, wherein the gate electrode comprises chromium, wherein the source electrode and the drain electrode comprise titanium.

4. An electronic device comprising:

a first lower material film;

a first upper material film on the first lower material film;

a first two-dimensional electron gas between the first lower material film and the first upper material film;

a second lower material film on the first upper material film;

a second upper material film on the second lower material film;

a second two-dimensional electron gas between the second lower material film and the second upper material film;

a source electrode on the second upper material film;

a drain electrode on the second upper material film;

a gate insulating film on the second upper material film; and a gate electrode on the gate insulating film, wherein the first two-dimensional electron gas is turned off when a magnitude of a potential difference between the gate electrode and the source electrode becomes greater than a magnitude of a first threshold voltage, wherein the second two-dimensional electron gas is turned off when the magnitude of the potential difference between the gate electrode and the source electrode becomes greater than a magnitude of a second threshold voltage, wherein the magnitude of the first threshold voltage is greater than the magnitude of the second threshold voltage, wherein a thickness of the first upper material film is 1.5 nm or more and less than 2.5 nm, wherein the thickness of the first upper material film is less than a thickness of the second upper material film, wherein the first upper material film and the second upper material film consist of aluminum oxide, wherein thicknesses of the first lower material film and the second lower material film are 2.5 nm or more and less than 6 nm, wherein the first lower material film and the second lower material film consist of zinc oxide, wherein the source electrode is in contact with a first side surface of the first lower material film, a first side surface of the first upper material film, a first side surface of the second lower material film, a first side surface of the second upper material film, and an upper surface of the second upper material film, wherein the drain electrode is in contact with a second side surface of the first lower material film, a second side surface of the first upper material film, a second side surface of the second lower material film, a second side surface of the second upper material film, and the upper surface of the second upper material film, wherein a first thickness group including the thickness of the second upper material film and the thickness of the first upper material film sets the first threshold voltage, wherein a second thickness group including a thickness of the gate insulating film and the thickness of the second upper material film sets the second threshold voltage, and wherein the electronic device is configured to operate in a "logic 2" state in which the first two-dimensional electron gas and the second two-dimensional electron gas are both on in response to the gate electrode receiving a voltage greater than the second threshold voltage, a "logic 1" state in which the first two-dimensional electron gas is on and the second two-dimensional electron gas is off in response to the gate electrode receiving a voltage between the first threshold voltage and the second threshold voltage, and a "logic 0" state in which the first two-dimensional electron gas and the second two-dimensional electron gas are both off in response to the gate electrode receiving a voltage less than the first threshold voltage.

5. The electronic device of claim 4, wherein the source electrode is in ohmic contact with the first two-dimensional electron gas and the second two-dimensional electron gas.

6. The electronic device of claim 4, wherein the second two-dimensional electron gas and the first two-dimensional electron gas are sequentially turned off by a difference between the magnitude of the first threshold voltage and the magnitude of the second threshold voltage.

7. The electronic device of claim 4, wherein the first two-dimensional electron gas and the second two-dimensional electron gas are a normally on-channel.

8. An electronic device comprising:

a first lower material film;

a first upper material film on the first lower material film;

a first two-dimensional electron gas between the first lower material film and the first upper material film;

a second lower material film on the first upper material film;

a second upper material film on the second lower material film;

a second two-dimensional electron gas between the second lower material film and the second upper material film;

a source electrode on the second upper material film;

a drain electrode on the second upper material film;

a gate insulating film on the second upper material film; and a gate electrode on the gate insulating film, wherein a thickness of the second upper material film is 1.5 nm or more, wherein a thickness of the first upper material film is 1.5 nm or more and less than 2.5 nm, wherein the first upper material film and the second upper material film consist of aluminum oxide, wherein thicknesses of the first lower material film and the second lower material film are 2.5 nm or more and less than 6 nm, wherein the first lower material film and the second lower material film consist of zinc oxide, wherein the source electrode is in contact with a first side surface of the first lower material film, a first side surface of the first upper material film, a first side surface of the second lower material film, a first side surface of the second upper material film, and an upper surface of the second upper material film, wherein the drain electrode is in contact with a second side surface of the first lower material film, a second side surface of the first upper material film, a second side surface of the second lower material film, a second side surface of the second upper material film, and the upper surface of the second upper material film, wherein a first thickness group including the thickness of the second upper material film and the thickness of the first upper material film sets a first threshold voltage, wherein a second thickness group including a thickness of the gate insulating film and the thickness of the second upper material film sets a second threshold voltage, wherein the second threshold voltage is greater than the first threshold voltage, and wherein the electronic device is configured to operate in a "logic 2" state in which the first two-dimensional electron gas and the second two-dimensional electron gas are both on in response to the gate electrode receiving a voltage greater than the second threshold voltage, a "logic 1" state in which the first two-dimensional electron gas is on and the second two-dimensional electron gas is off in response to the gate electrode receiving a voltage between the first threshold voltage and the second threshold voltage, and a "logic 0" state in which the first two-dimensional electron gas and the second two-dimensional electron gas are both off in response to the gate electrode receiving a voltage less than the first threshold voltage.

9. The electronic device of claim 8, wherein the thickness of the first upper material film is at least 0.5 times the thickness of the second upper material film.

10. The electronic device of claim 8, wherein the gate electrode comprises chromium, and wherein the source electrode and the drain electrode comprise titanium.

* * * * *